(12) United States Patent
Kuribayashi et al.

(10) Patent No.: US 8,409,352 B2
(45) Date of Patent: Apr. 2, 2013

(54) METHOD OF MANUFACTURING SEMICONDUCTOR DEVICE, METHOD OF MANUFACTURING SUBSTRATE AND SUBSTRATE PROCESSING APPARATUS

(75) Inventors: Koei Kuribayashi, Toyama (JP); Yoshinori Imai, Toyama (JP); Sadao Nakashima, Toyama (JP); Takafumi Sasaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 133 days.

(21) Appl. No.: 13/036,330

(22) Filed: Feb. 28, 2011

(65) Prior Publication Data
US 2011/0212599 A1 Sep. 1, 2011

(30) Foreign Application Priority Data

Mar. 1, 2010 (JP) ................................. 2010-044088
Mar. 16, 2010 (JP) ................................. 2010-059656
Dec. 16, 2010 (JP) ................................. 2010-280484
Dec. 22, 2010 (JP) ................................. 2010-285773

(51) Int. Cl.
*C23C 16/00* (2006.01)
*C23C 16/455* (2006.01)

(52) U.S. Cl. .......................... 118/715; 118/724; 118/725

(58) Field of Classification Search .................. 118/715, 118/724, 725
See application file for complete search history.

(56) References Cited

U.S. PATENT DOCUMENTS 4,369,031 A * 1/1983 Goldman et al. ............. 432/198
6,306,211 B1 10/2001 Takahashi et al.
6,402,849 B2 * 6/2002 Kwag et al. ................... 118/715
7,419,550 B2 * 9/2008 Suzuki et al. ................. 118/715
7,795,158 B2 * 9/2010 Fujita et al. .................... 438/770
7,964,516 B2 * 6/2011 Okada et al. ................. 438/787
8,071,477 B2 * 12/2011 Moriya et al. ............... 438/680
8,178,428 B2 * 5/2012 Noda et al. .................... 438/488

(Continued)

FOREIGN PATENT DOCUMENTS

JP 01081216 A * 3/1989
JP 2000-297375 A 10/2000

(Continued)

OTHER PUBLICATIONS

Okumura Hajime, Kojima Kazutoshi, Fukuda Kenji, "Fundamentals and Applications of SiC Semiconductor," Published by ED Research, p. 27, Fig. 4.5) (English Translation of Fig. 4.5 included).

*Primary Examiner* — Jeffrie R Lund
(74) *Attorney, Agent, or Firm* — Volpe and Koenig, P.C.

(57) ABSTRACT

An apparatus including a reaction chamber in which substrates are stacked; a first gas supply nozzle installed in a region in which the substrates are stacked; a second gas supply nozzle installed in a different position; a first branch nozzle installed at the first gas supply nozzle in a direction parallel to major surfaces of the substrates, a line of which is branched in a direction of the second gas supply nozzle, and including a first gas supply port; and a second branch nozzle installed at the second gas supply nozzle in the direction parallel to the major surfaces of the substrates, a line of which is branched in a direction of the first gas supply nozzle, and including a second gas supply port; wherein the first gas supply port and the second gas supply port are installed adjacent to each other in a direction that the substrates are stacked.

13 Claims, 23 Drawing Sheets

U.S. PATENT DOCUMENTS

| | | | |
|---|---|---|---|
| 2001/0025605 A1* | 10/2001 | Nagakura | 118/715 |
| 2002/0073923 A1* | 6/2002 | Saito et al. | 118/715 |
| 2005/0087299 A1* | 4/2005 | Okabe et al. | 156/345.26 |
| 2006/0207504 A1* | 9/2006 | Hasebe et al. | 118/715 |
| 2007/0034158 A1* | 2/2007 | Nakaiso | 118/725 |
| 2007/0234961 A1* | 10/2007 | Takahashi et al. | 118/723 R |
| 2008/0060580 A1* | 3/2008 | Toyoda et al. | 118/725 |
| 2008/0075838 A1* | 3/2008 | Inoue et al. | 427/58 |
| 2008/0145533 A1* | 6/2008 | Honda et al. | 427/248.1 |
| 2008/0213479 A1* | 9/2008 | Chou et al. | 427/255.393 |
| 2009/0130829 A1* | 5/2009 | Noda et al. | 438/503 |
| 2009/0223448 A1* | 9/2009 | Sakai et al. | 118/715 |
| 2009/0263975 A1* | 10/2009 | Kadonaga et al. | 438/763 |
| 2009/0291566 A1* | 11/2009 | Ueno et al. | 438/758 |
| 2009/0305517 A1* | 12/2009 | Nakashima et al. | 438/786 |
| 2010/0081094 A1* | 4/2010 | Hasebe et al. | 430/323 |
| 2010/0081288 A1* | 4/2010 | Nakaiso | 438/758 |
| 2010/0151682 A1* | 6/2010 | Moriya et al. | 438/680 |
| 2010/0154711 A1* | 6/2010 | Ishibashi et al. | 118/725 |
| 2010/0186898 A1* | 7/2010 | Fukushima et al. | 156/345.48 |
| 2010/0218724 A1* | 9/2010 | Okada | 118/724 |
| 2011/0021033 A1* | 1/2011 | Ikeuchi et al. | 438/758 |
| 2011/0130011 A1* | 6/2011 | Sasajima et al. | 438/770 |
| 2011/0186984 A1* | 8/2011 | Saito et al. | 257/734 |
| 2011/0212599 A1* | 9/2011 | Kuribayashi et al. | 438/478 |
| 2011/0281443 A1* | 11/2011 | Chou et al. | 438/787 |
| 2011/0290182 A1* | 12/2011 | Sakai et al. | 118/715 |
| 2011/0294280 A1* | 12/2011 | Takasawa et al. | 438/478 |
| 2011/0303152 A1* | 12/2011 | Asari et al. | 118/725 |
| 2011/0312188 A1* | 12/2011 | Wamura et al. | 438/758 |
| 2012/0079985 A1* | 4/2012 | Yamazaki et al. | 118/724 |
| 2012/0100722 A1* | 4/2012 | Asai et al. | 438/758 |
| 2012/0103518 A1* | 5/2012 | Kakimoto et al. | 156/345.1 |
| 2012/0103525 A1* | 5/2012 | Matsuura et al. | 156/345.48 |
| 2012/0122318 A1* | 5/2012 | Sakai et al. | 438/758 |
| 2012/0156886 A1* | 6/2012 | Shirako et al. | 438/706 |
| 2012/0199067 A1* | 8/2012 | Morozumi et al. | 118/719 |
| 2012/0214300 A1* | 8/2012 | Kaga et al. | 438/597 |
| 2012/0214317 A1* | 8/2012 | Murobayashi et al. | 438/782 |
| 2012/0220108 A1* | 8/2012 | Hara et al. | 438/478 |
| 2012/0220137 A1* | 8/2012 | Ota et al. | 438/765 |
| 2012/0244721 A1* | 9/2012 | Morozumi et al. | 438/778 |
| 2012/0269969 A1* | 10/2012 | Suzuki et al. | 427/255.28 |
| 2012/0305026 A1* | 12/2012 | Nomura et al. | 134/10 |

FOREIGN PATENT DOCUMENTS

| | | |
|---|---|---|
| JP | 2003-264154 A | 9/2003 |
| JP | 2006-196807 A | 7/2006 |
| JP | 2008-227460 A | 9/2008 |

* cited by examiner

A-A Cross-sectional view

B-B Cross-sectional view

C-C Cross-sectional view

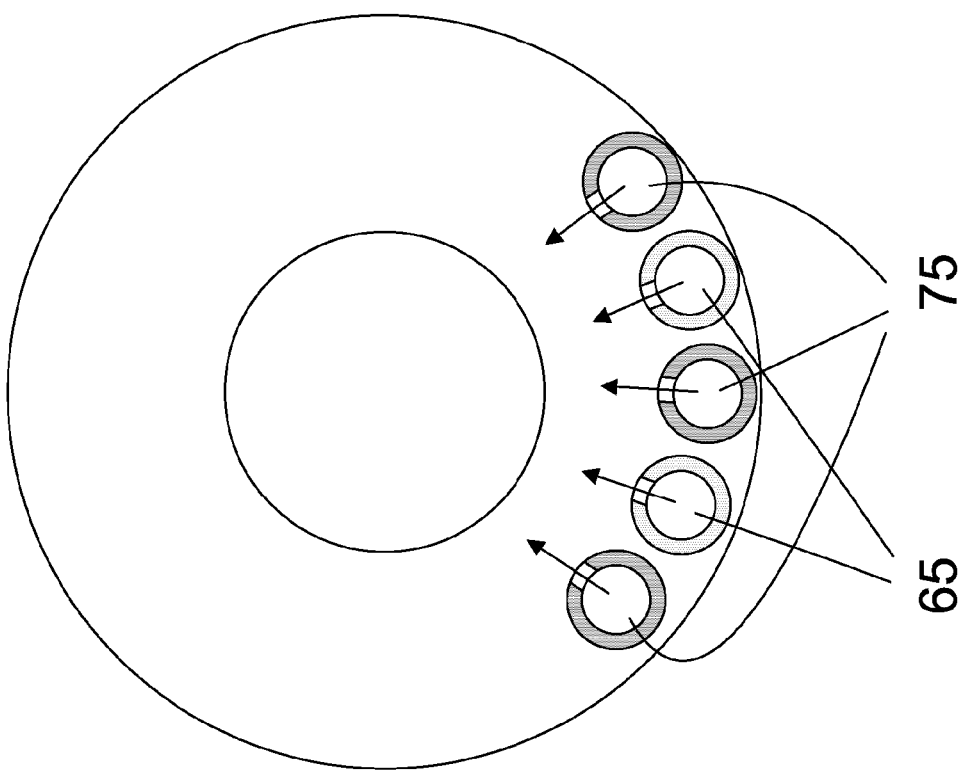

US 8,409,352 B2

METHOD OF MANUFACTURING SEMICONDUCTOR DEVICE, METHOD OF MANUFACTURING SUBSTRATE AND SUBSTRATE PROCESSING APPARATUS

CROSS-REFERENCE TO RELATED PATENT APPLICATION

This application claims priority to and the benefit of Japanese Patent Application Nos. 2010-044088 filed on Mar. 1, 2010, 2010-059656 filed on Mar. 16, 2010, 2010-280484 filed on Dec. 16, 2010 and 2010-285773 filed on Dec. 22, 2010, the disclosure of which is incorporated herein by reference.

FIELD OF THE INVENTION

The present invention relates to a method of manufacturing a semiconductor device including a step of processing a substrate, a method of manufacturing a substrate and a substrate processing apparatus, and more particularly, to a method of manufacturing a semiconductor device including a step of forming a silicon carbide (hereinafter, referred to as SiC) film on a substrate, a method of manufacturing a substrate and a substrate processing apparatus.

DESCRIPTION OF THE RELATED ART

SiC is attracting attention as, in particular, a device material for a power device. Meanwhile, SiC is known as a material with which it is difficult to manufacture a crystalline substrate or device in comparison with silicon (Si).

In a conventional semiconductor manufacturing apparatus for forming a SiC film, a plurality of substrates are disposed in parallel on a plate-type susceptor, the plurality of substrates are heated to a temperature of 1500° C. to 1800° C., and a source gas used in film formation is supplied into a reaction chamber from one place, forming SiC epitaxial films on the substrates.

According to Patent Document 1, in order to solve problems such as adhesion of deposits to a surface opposite to a susceptor, caused by a source gas and instability of SiC film growth due to generation of convection of the source gas, a vacuum film-forming apparatus in which a surface for holding a substrate of the susceptor is directed downward and a thin film forming method are disclosed.

PRIOR ART DOCUMENT

Patent Document

[Patent Document] Japanese Patent Laid-open Publication No.: 2006-196807

However, the related arts have several problems. First, since there is a need to increase a size of a susceptor when a plurality of substrates are to be processed or when a diameter of the substrates is increased as shown in FIG. 11, a footprint of a reaction chamber must be increased. In addition, since a source gas is supplied from one place, distribution of gas concentration in the reaction chamber becomes non-uniform, and a thickness of a film formed on a wafer becomes non-uniform. Further, since growth of a SiC epitaxial film is performed at a high temperature of 1500° C. to 1800° C., temperature control in a surface of the wafer becomes difficult, and uniform doping of impurities onto the SiC film also becomes difficult.

SUMMARY OF THE INVENTION

In order to solve these problems, it is an object of the present invention to provide a method of manufacturing a semiconductor device, a method of manufacturing a substrate and a substrate processing apparatus that are capable of uniformly forming films on a plurality of substrates in SiC epitaxial film growth, which is performed under a high temperature condition.

According to an aspect of the present invention, there is provided a method of manufacturing a semiconductor device or a method of manufacturing a substrate in a substrate processing apparatus including: a reaction chamber having therein a plurality of substrates stacked to have a predetermined distance therebetween; a first gas supply system configured to supply one of a mixture of a silicon-containing gas and a chlorine-containing gas and a silicon/chlorine-containing gas into the reaction chamber; a second gas supply system configured to supply at least a carbon-containing gas and a reduction gas into the reaction chamber; a first gas supply nozzle installed and extending in a region where the plurality of substrates are stacked; a second gas supply nozzle extending in the region, the second gas supply nozzle being installed in a position different from that of the first gas supply nozzle; a first branch nozzle installed at the first gas supply nozzle in a direction parallel to a major surface of each of the plurality of substrates, the first branch nozzle being branched toward the second gas supply nozzle and including at least one first gas supply port; and a second branch nozzle installed at the second gas supply nozzle in the direction parallel to the major surface of each of the plurality of substrates, the second branch nozzle being branched toward the first gas supply nozzle, and including at least one second gas supply port; wherein the at least one first gas supply port and the at least one second gas supply port are installed adjacent to each other in a stacking direction of the plurality of substrates, the method including the steps of: loading the plurality of substrates into the reaction chamber; and supplying one of a mixture of the silicon-containing gas and the chlorine-containing gas and a silicon/chlorine-containing gas into the reaction chamber through the at least one first gas supply port and supplying at least a carbon-containing gas and a reduction gas into the reaction chamber through the at least one second gas supply port to form a silicon carbide film.

According to another aspect of the present invention, there is provided a substrate processing apparatus including: a reaction chamber having therein a plurality of substrates stacked to have a predetermined distance therebetween; a first gas supply system configured to supply one of a mixture of a silicon-containing gas and a chlorine-containing gas and a silicon/chlorine-containing gas into the reaction chamber; a second gas supply system configured to supply at least a carbon-containing gas and a reduction gas into the reaction chamber; a first gas supply nozzle installed and extending in a region where the plurality of substrates are stacked; a second gas supply nozzle extending in the region, the second gas supply nozzle being installed in a position different from that of the first gas supply nozzle; a first branch nozzle installed at the first gas supply nozzle in a direction parallel to a major surface of each of the plurality of substrates, the first branch nozzle being branched toward the second gas supply nozzle and including at least one first gas supply port; a second branch nozzle installed at the second gas supply nozzle in the direction parallel to the major surface of each of the plurality of substrates, second branch nozzle being branched toward the first gas supply nozzle, and including at least one second gas supply port; and a controller configured to control the first gas supply system and the second gas supply system to supply one of the mixture of the silicon-containing gas and the chlorine-containing gas and the silicon/chlorine-containing gas into the reaction chamber through the at least one first gas supply port and supply at least the carbon-containing gas and the reduction gas into the reaction chamber through the at least one second gas supply port such that a silicon carbide film is formed on each of the plurality of substrates, wherein the at least one first gas supply port and the at least one second gas supply port are installed adjacent to each other in a stacking direction of the plurality of substrates.

According to still another aspect of the present invention, there is provided a method of manufacturing a semiconductor device or a method of manufacturing a substrate in a substrate processing apparatus including: a reaction chamber in which substrates are vertically stacked and arranged at a predetermined distance; at least one first gas supply nozzle installed to extend to an arrangement region of the substrates in the reaction chamber; at least one second gas supply nozzle installed to extend to a different position from a position at which the first gas supply nozzle is installed in the arrangement region of the substrates in the reaction chamber; at least one first gas supply port installed at the first gas supply nozzle; and at least one second gas supply port installed at the second gas supply nozzle, wherein the second gas supply nozzle is installed between the substrates and the first gas supply nozzle, the method including the steps of: loading the substrates vertically stacked and arranged at a predetermined distance into the reaction chamber; forming SiC films by supplying at least a silicon-containing gas and a chlorine-containing gas through the first gas supply port and supplying at least a carbon-containing gas and a reduction gas through the second gas supply port; and unloading the substrates from the reaction chamber.

According to yet another aspect of the present invention, there is provided a substrate processing apparatus including: a reaction chamber having therein substrates vertically stacked and arranged to have at a predetermined distance therebetween; a first gas supply system configured to supply at least a silicon-containing gas and a chlorine-containing gas into the reaction chamber; a second gas supply system configured to supply at least a carbon-containing gas and a reduction gas into the reaction chamber; a first gas supply nozzle installed and extending in a region where the substrates are stacked and arranged; a second gas supply nozzle extending in the region, the second gas supply nozzle being installed in a position different from that of the first gas supply nozzle; at least one gas supply port installed at the first gas supply nozzle; at least one second gas supply port installed at the second gas supply nozzle; and a controller configured to control the first gas supply system and the second gas supply system to supply at least the silicon-containing gas and the chlorine-containing gas into the reaction chamber through the at least one first gas supply port and supply at least the carbon-containing gas and the reduction gas into the reaction chamber through the at least one second gas supply port such that a silicon carbide film is formed on each of the substrates, wherein the second gas supply nozzle is installed between the substrates and the first gas supply nozzle.

According to the present invention, a semiconductor manufacturing apparatus and method capable of uniformly forming a SiC film on a substrate can be provided.

Figure 20A:
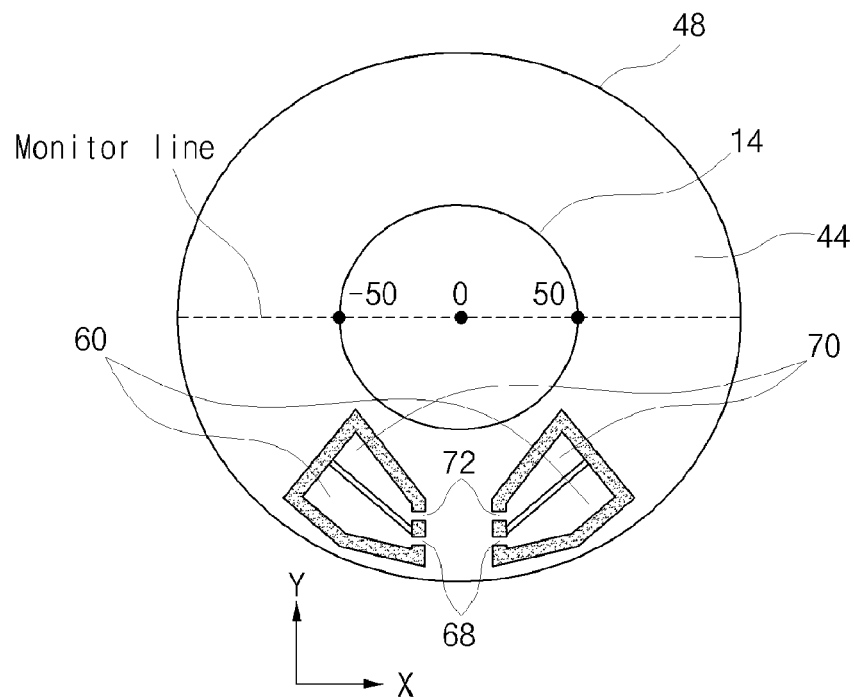
FIG. 20 shows the semiconductor manufacturing apparatus 10 according to the fifth embodiment of the present invention, FIG. 20A showing a horizontal cross-sectional view when seen from the upper surface thereof, FIG. 20B exemplifying a C/Si ratio and a film forming rate on a monitor line of FIG.
Figure 20B:
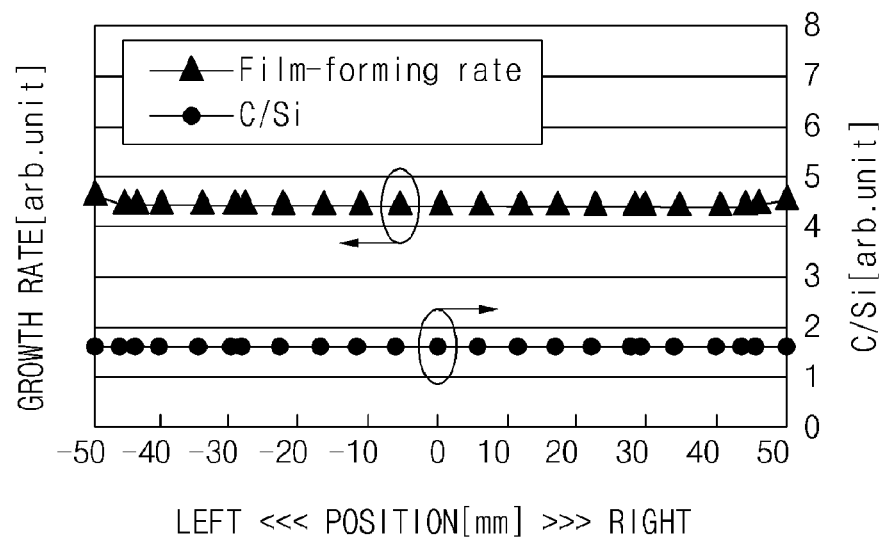
Figure 20C:
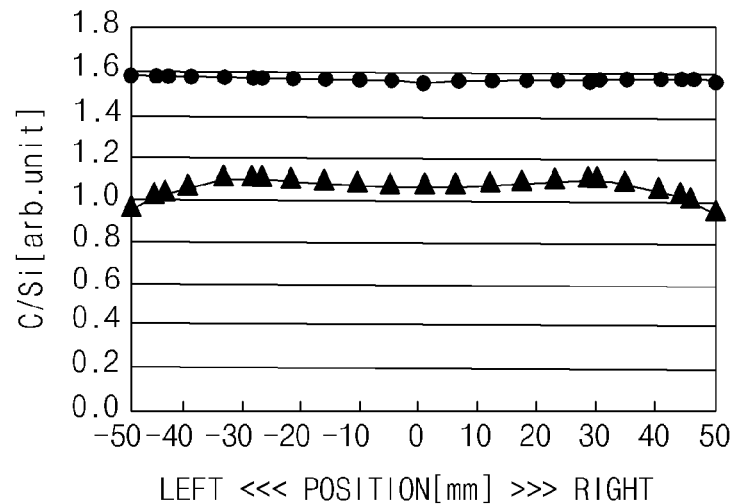
Figure 21:
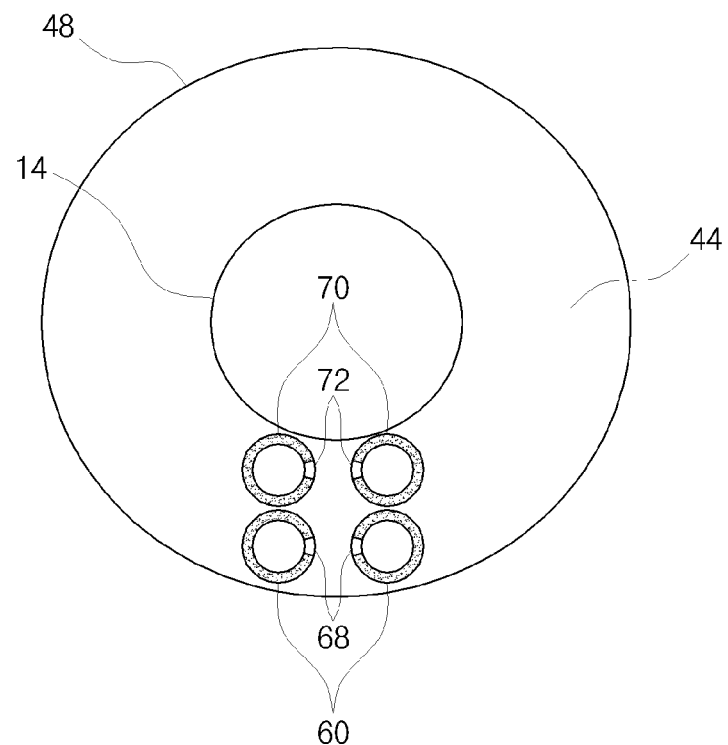
Figure 22:
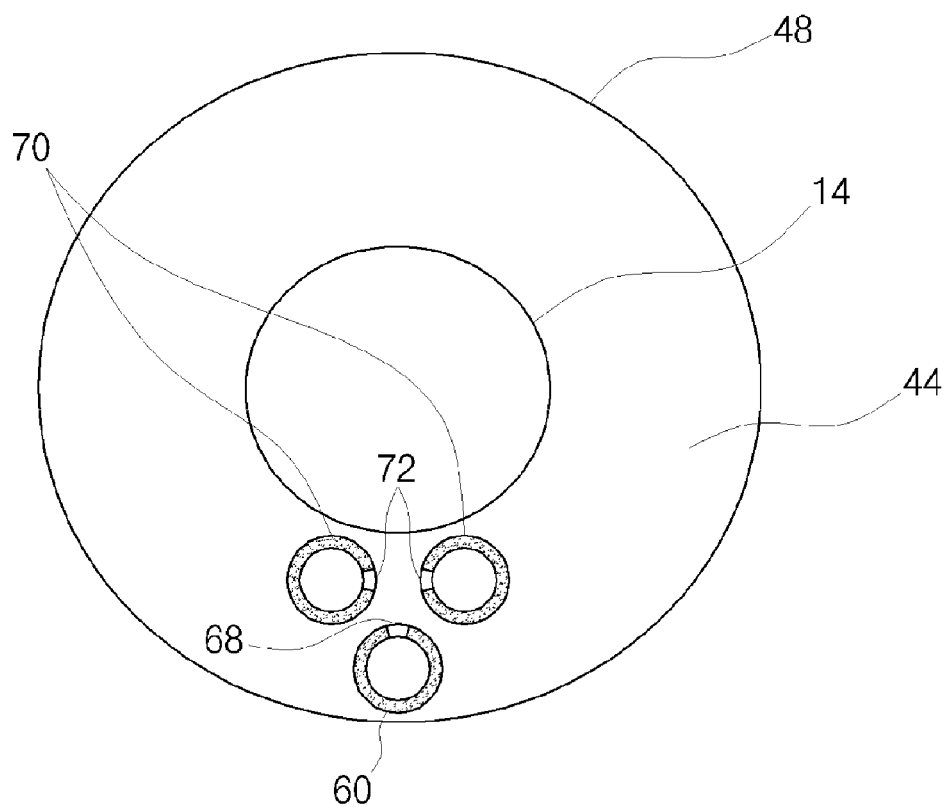

20A, and FIG. 20C exemplifying a concentration ratio C/Si of the first embodiment and the modified example A on the monitor line of FIG. 20A;

FIG. 21 is a horizontal cross-sectional view of a semiconductor manufacturing apparatus 10 according to a sixth embodiment of the present invention, when seen from an upper surface thereof; and FIG. 22 is a horizontal cross-sectional view of a semiconductor manufacturing apparatus 10 according to a seventh embodiment of the present invention, when seen from an upper surface thereof.

DETAILED DESCRIPTION OF THE PREFERRED EMBODIMENTS

First Embodiment

Figure 1:
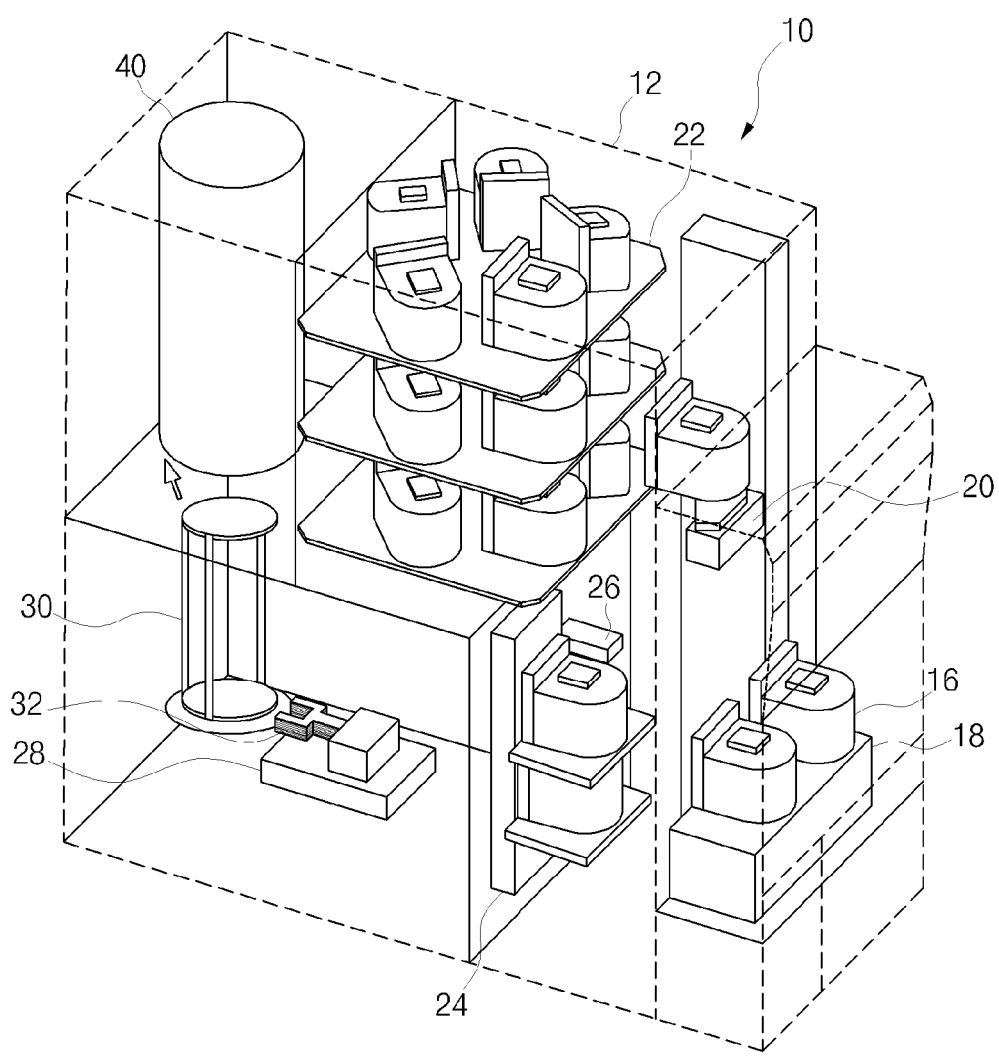
FIG. 1 is a perspective view of a semiconductor manufacturing apparatus 10 according to a first embodiment of the present invention.

Hereinafter, an embodiment of the present invention will be described with reference to the accompanying drawings. FIG. 1 is a perspective view showing an example of a semiconductor manufacturing apparatus 10 for forming a SiC epitaxial film according to the first embodiment of the present invention. The semiconductor manufacturing apparatus 10 serving as a substrate processing apparatus, is a batch-type vertical heat treatment apparatus, and includes a housing in which major components are disposed. In the semiconductor manufacturing apparatus 10, a front opening unified pod (FOUP; hereinafter, referred to as a pod) 16 is used as a substrate accommodating unit. The substrate accommodating unit accommodates a wafer 14 such as a substrate made of, for example, Si, SiC, etc. The pod 16 is used as a wafer carrier. A pod stage 18 is disposed in the front of the housing 12, and the pod 16 is conveyed to the pod stage 18. The pod 16 accommodates, for example, twenty five sheets of wafers 14. The pod 16 is placed on the pod stage 18 with a lid of the pod 16 closed.

A pod conveyance apparatus 20 is disposed in the front of the housing 12 and vertically opposite to the pod stage 18. In addition, a pod storage apparatus 22, a pod opener 24 and a substrate number detector 26 are disposed near the pod conveyance apparatus 20. The pod storage apparatus 22 is disposed over the pod opener 24, and configured to hold a plurality of pods 16 placed thereon. The substrate number detector 26 is disposed near the pod opener 24. The pod conveyance apparatus 20 conveys the pod 16 among the pod stage 18, the pod storage apparatus 22 and the pod opener 24. The pod opener 24 opens the lid of the pod 16. The substrate number detector 26 detects the number of wafers 14 in the pod 16 whose lid is open.

A substrate transfer apparatus 28 and a boat 30, which is a substrate holder, are disposed in the housing 12. The substrate transfer apparatus 28 includes an arm 32 (tweezers) and is configured to be able to vertically move and horizontally rotate by a driving means (not shown). The arm 32 can take out, for example, five sheets of wafers. As the arm 32 moves, the wafers 14 are transferred between the pod 16, placed on a position of the pod opener 24, and the boat 30.

The boat 30 is configured to concentrically align the plurality of wafers 14 in a horizontal posture and stack and hold the wafers 14 in a vertical direction. The boat 30 is made of a heat resistant material, for example, carbon graphite, SiC, etc. In addition, a boat insulating part 34 serving as a disk-shaped insulating member made of a heat resistant material, for example, quartz, SiC, etc. is disposed under the boat 30. The boat insulating part 34 is configured such that heat from an object to be heated 48, which will be described later, cannot easily be conveyed to a lower side of a processing furnace 40 (see FIG. 2).

The processing furnace 40 is disposed near an upper part of a rear surface in the housing 12. The boat 30 in which the plurality of wafers 14 are charged is loaded into the processing furnace 40. Heat processing of the plurality of wafers 14 is performed in the processing furnace 40.

Figure 2:
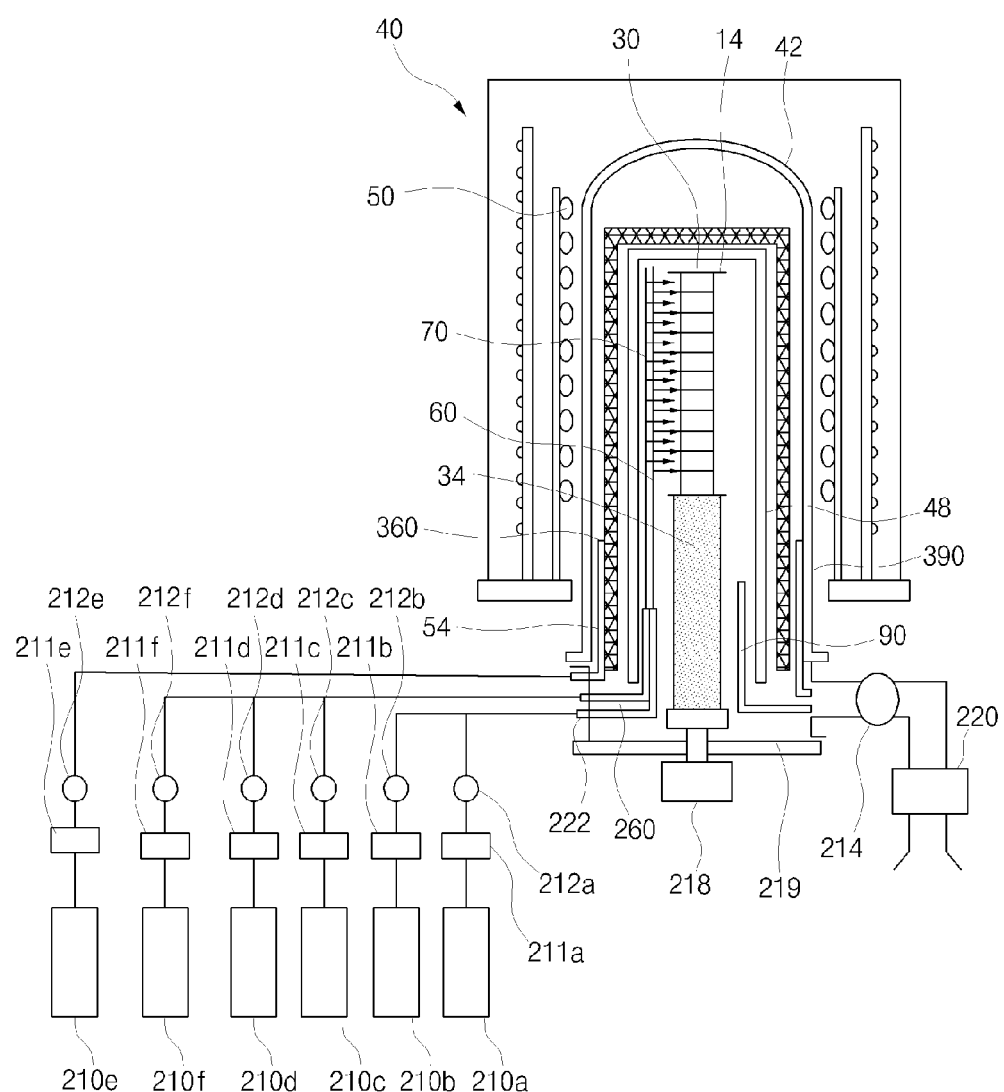
FIG. 2 is a side cross-sectional view of the semiconductor manufacturing apparatus 10 according to the first embodiment of the present invention.
Figure 3:
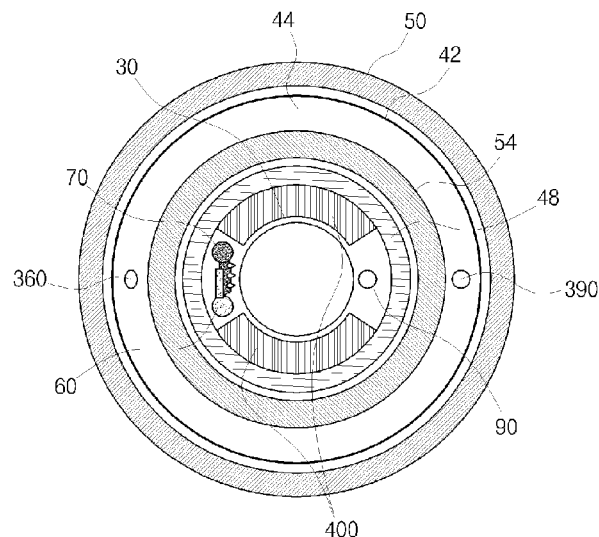
FIG. 3 is a top cross-sectional view of the semiconductor manufacturing apparatus 10 according to the first embodiment of the present invention.

FIGS. 2 and 3 show a side cross-sectional view and an upper cross-sectional view of the processing furnace 40 of the semiconductor manufacturing apparatus 10 for forming the SiC epitaxial film, respectively. In addition, a gas supply nozzle 60, a gas supply nozzle 70 and an exhaust port 90 are shown as typical examples, respectively. The gas supply nozzle 60 includes a first gas supply port 68 configured to supply at least a silicon-containing gas and a chlorine-containing gas. The gas supply nozzle 70 includes a second gas supply port 72 configured to supply at least a carbon-containing gas, a reduction gas, for example, hydrogen gas, and a doping gas containing, for example, n-type impurities. In addition, a third gas supply port 360 and a second gas exhaust port 390 are shown. The third gas supply port 360 supplies an inert gas between a reaction tube 42, which configures a reaction chamber, and an insulating material 54.

The processing furnace 40 includes the reaction tube 42. The reaction tube 42 forms, for example, a cylindrical reaction chamber 44. The reaction tube 42 is made of a heat resistant material such as quartz or SiC. The reaction tube 42 has, for example, a cylindrical shape with its upper end closed and its lower end open. The reaction chamber 44 is formed in a cylindrical hollow part inside the reaction tube 42. The reaction chamber 44 is configured to accommodate the wafers 14, which are substrate made of Si or SiC, in a state in which the wafers 14 are concentrically aligned by the boat 30 in a horizontal posture and stacked and held in a vertical direction.

A manifold is concentrically installed under the reaction tube 42. The manifold is made of, for example, stainless steel, etc. The manifold has a cylindrical shape with its upper and lower ends open. The manifold is installed to support the reaction tube 42. In addition, an O-ring is installed as a seal member between the manifold and the reaction tube 42. As the manifold is supported by a retainer (not shown), the reaction tube 42 is vertically installed. A reaction container is configured by the reaction tube 42 and the manifold.

The processing furnace 40 includes the object to be heated 48 heated therein. The object to be heated 48 is disposed in the reaction chamber 44. The object to be heated 48 is heated by a magnetic field generated by an induction coil 50 installed outside the reaction tube 42. As the objected to be heated 48 generates heat, an inside of the object to be heated 48 is heated.

A temperature sensor (not shown) serving as a temperature detector configured to detect a temperature in the reaction chamber 44 is installed near the object to be heated 48. A temperature control unit 52 is electrically connected to the induction coil 50 and the temperature sensor. The temperature control unit 52 regulates a state of conduction to the induction coil 50 based on temperature information detected by the temperature sensor. The temperature control unit 52 controls the state of conduction at predetermined timings such that the temperature inside the object to be heated 48 is at a predetermined temperature distribution (see FIG. 4).

In addition, preferably, in the reaction chamber 44, structures 400 are installed between the first and second gas supply nozzles 60 and 70 and the first gas exhaust port 90 and between the object to be heated 48 and the wafers 14. For example, as shown in FIG. 3, the structures 400 are installed at opposite positions, respectively. Preferably, the structures 400 may be made of an insulating material, for example, carbon felt, etc. When the structures 400 are made of the insulating material, a heat resistant property of the processing furnace may be improved. In addition, for example, generation of particles due to deterioration of the structures 400 may be suppressed.

An insulating material 54 made of, for example, carbon felt that is not easily induction-heated, is installed between the object to be heated 48 and the reaction tube 42. As the insulating material 54 is installed, transfer of the heat of the object to be heated 48 to the reaction tube 42 or an outside of the reaction tube 42 may be suppressed.

In addition, an outer insulating wall, for example, a cooling structure, is installed outside the induction coil 50 to suppress transfer of the heat in the reaction chamber 44 to the outside. The outer insulating wall is installed to surround the reaction chamber 44. In addition, a magnetic shield is installed outside the outer insulating wall to prevent a magnetic field generated by the induction coil 50 from leaking to the outside.

As shown in FIG. 2, the first gas supply port 68, the second gas supply port 72 and the first gas exhaust port 90 are disposed. The first gas supply port 68 is installed between the object to be heated 48 and the wafers 14 and supplies at least a silicon-containing gas and a chlorine-containing gas, and at least one first gas supply port 68 is installed at the first gas supply nozzle 60. At least one second gas supply port 72 is installed at the second gas supply nozzle 70 installed at a different place from the first gas supply nozzle in the reaction chamber, and supplies at least a carbon-containing gas, a reduction gas, for example, $H_2$ gas, and an impurity gas, for example, an n-type impurity gas. In addition, the third gas supply port 360 and the second gas exhaust port 390 are disposed between the reaction tube 42 and the insulating material 54, which will be described later in detail.

The first gas supply port 68 supplies at least a silicon-containing gas, for example, silane ($SiH_4$) gas, and a chlorine-containing gas, for example, hydrogen chloride (HCl) gas, through the first gas supply nozzle 60. The first gas nozzle 60 is made of, for example, carbon graphite. The first gas supply port 68 is installed inside the object to be heated 48. The first gas supply nozzle 60 is installed at the manifold to pass through the manifold. In addition, the first gas supply nozzle 60 may be installed in plural.

The gas supply nozzle 60 is connected to a first gas line 222. The first gas line 222 is connected to, for example, a $SiH_4$ gas source 210$a$ and an HCl gas source 210$b$ of, for example, $SiH_4$ gas and HCl gas, respectively via mass flow controllers (hereinafter, referred to as MFCs) 211$a$ and 211$b$ and valves 212$a$ and 212$b$ as a flow rate controller (flow rate control unit).

According to the above configuration, in the reaction chamber 44, for example, supply flow rates, concentrations and partial pressures of $SiH_4$ gas and HCl gas may be controlled, respectively. The valves 212$a$ and 212$b$ and the MFCs 211$a$ and 211$b$ are electrically connected to a gas flow rate control unit 78. The gas flow rate control unit 78 controls the valves 212$a$ and 212$b$ and the MFCs 211$a$ and 211$b$ at predetermined timings such that the flow rates of the supplied gases become predetermined flow rates, respectively (see FIG. 4). For example, the gas sources 210$a$ and 210$b$ of $SiH_4$ gas and HCl gas, the valves 212$a$ and 212$b$, the MFCs 211$a$ and 211$b$, the gas line 222, the gas supply nozzle 60, and the at least one gas supply port 68 installed at the gas supply nozzle 60 constitute a first gas supply system as a gas supply system.

In addition, in the above embodiment, while the chlorine-containing gas is exemplified by HCl gas, $Cl_2$ gas may be used as the chlorine-containing gas. In addition, a carrier gas such as a rare gas or a hydrogen-containing gas may be supplied to a film-forming contribution gas. The rare gas may include helium (He) gas, neon (Ne) gas, argon (Ar) gas, krypton (Kr) gas, xenon (Xe) gas, and so on. Further, the hydrogen-containing gas is exemplified by $H_2$ gas.

Preferably, the rare gas may be supplied as the carrier gas. When the hydrogen-containing gas, for example, $H_2$ gas, is supplied as the carrier gas, due to a reducing effect of the $H_2$ gas, the silicon-containing gas is decomposed in the gas supply nozzle, and a Si film is accumulated in the gas supply nozzle. Accordingly, an inside of the gas supply nozzle or the gas supply port may be blocked, or particles may be generated.

In addition, preferably, Ar gas may be supplied as the carrier gas. Since Ar gas is less expensive than other rare gases such as He gas, operation cost when the substrate processing apparatus for forming the SiC epitaxial film is operated may be reduced.

Further, in the above embodiment, while the silicon-containing gas and chlorine-containing gas are supplied, preferably, a gas containing Si and Cl, for example, tetrachlorosilane ($SiCl_4$) gas, trichlorosilane ($SiHCl_3$) gas or dichlorosilane ($SiH_2Cl_2$) may be supplied. In addition, preferably, $SiCl_4$ gas may be supplied. Accordingly, formation of a film in the gas supply nozzle may be suppressed, and the gas may be supplied into the reaction chamber with gas consumption suppressed.

The second gas supply port 72 supplies at least a carbon-containing gas, for example, propane ($C_3H_8$) gas, and a reduction gas such as a hydrogen-containing gas, for example, $H_2$ gas, through the second gas supply nozzle 70. The second gas supply port 72 is made of, for example, carbon graphite. The second gas supply port 72 is installed inside the object to be heated 48. The second gas supply nozzle 70 is installed at the manifold to pass through the manifold. In addition, the second gas supply nozzle 70 may be installed in plural.

The second gas supply nozzle 70 is connected to a second gas line 260. The second gas line 260 is connected to a $C_3H_8$ gas source 210$d$ via an MFC 211$c$ and a valve 212$c$ to supply a carbon-containing gas, for example, $C_3H_8$ gas. In addition, the second gas line 260 is connected to a $H_2$ gas source 210$d$ via an MFC 211$d$ and a valve 212$d$ to supply a reduction gas, for example, $H_2$ gas.

According to the above configuration, for example, supply flow rates, concentrations and partial pressures of the $C_3H_8$ gas and $H_2$ gas in the reaction chamber 44 may be controlled. The valves 212$c$ and 212$d$ and the MFCs 211$c$ and 211$d$ are electrically connected to the gas flow rate control unit 78. The gas flow rate control unit 78 controls the valves 212$c$ and 212$d$ and the MFCs 211$c$ and 211$d$ at predetermined timings such that the flow rates of the supplied gases become predetermined flow rates (see FIG. 4). For example, the gas sources 210$c$ and 210$d$ of the $C_3H_8$ gas and $H_2$ gas, the valves 212$c$ and 212$d$, the MFCs 211$c$ and 211$d$, the gas line 260, the second gas supply nozzle 70 and the second gas supply port 72 constitute a second gas supply system as a gas supply system.

In addition, while $C_3H_8$ gas is exemplified as a carbon-containing gas in this embodiment, ethylene ($C_2H_4$) gas or acetylene ($C_2H_2$) gas may be used.

Further, while $H_2$ gas is exemplified as a reduction gas in this embodiment, it is not limited thereto but a gas containing $H_2$ may be supplied.

Here, in this embodiment, the silicon-containing gas is supplied via the first gas supply nozzle 60 and the $H_2$ gas, which is the reduction gas, is supplied via the second gas supply nozzle 70. Similar to the embodiment, when the gas supply nozzle is disposed in the reaction chamber 44 to improve uniformity between the wafers 14. If the reduction gas is supplied together with the silicon-containing gas, decomposition of the silicon-containing gas is promoted. Accordingly, a Si film may be deposited in the gas supply nozzle. In this case, while the silicon-containing gas is consumed at an upstream side. However, as the silicon-containing gas and the reduction gas are separately supplied, deposition in the gas supply nozzle and consumption of the silicon-containing gas may be suppressed.

In addition, in this embodiment, the carbon-containing gas is supplied via the second gas supply nozzle 70. The carbon-containing gas is supplied separately from the silicon-containing gas. Accordingly, deposition of the SiC film in the gas supply nozzle may be suppressed. Further, blocking of the gas supply port and generation of particles or contaminants due to peeling of the formed film may be suppressed. Furthermore, when deposition of the SiC film in the gas supply nozzle can be substantially prevented by separately supplying the silicon-containing gas and the reduction gas, the silicon-containing gas and the carbon-containing gas may be supplied via the same gas supply nozzle. As a result, since the silicon-containing gas and the carbon-containing gas may be previously mixed, uniform films may be formed on the wafers 14.

Here, a reason for configuring the first gas supply system and the second gas supply system will be described in detail. In the conventional semiconductor manufacturing apparatus for forming the SiC epitaxial film, the plurality of wafers 14 are arranged on the susceptor not to overlap each other, and the source gas configured by the silicon-containing gas, the carbon-containing gas, the reduction gas, etc. is supplied from one place of the reaction chamber 44 to form the SiC epitaxial film. In this embodiment, the semiconductor manufacturing apparatus concentrically aligns the plurality of wafers 14 made of SiC, etc. in a horizontal posture and vertically stacks and holds the wafers 14, and supplies the source gas through the gas supply nozzle extending in a vertical direction thereof. At this time, since the source gas is consumed in the gas supply nozzle, lack of the source gas occurs at a downstream side of the gas supply nozzle. In addition, problems such as blocking of the gas supply nozzle by the deposition such as the SiC film reacted and deposited in the gas supply nozzle, instability of supply of the source gas, or generation of particles may easily occur.

Figure 16:
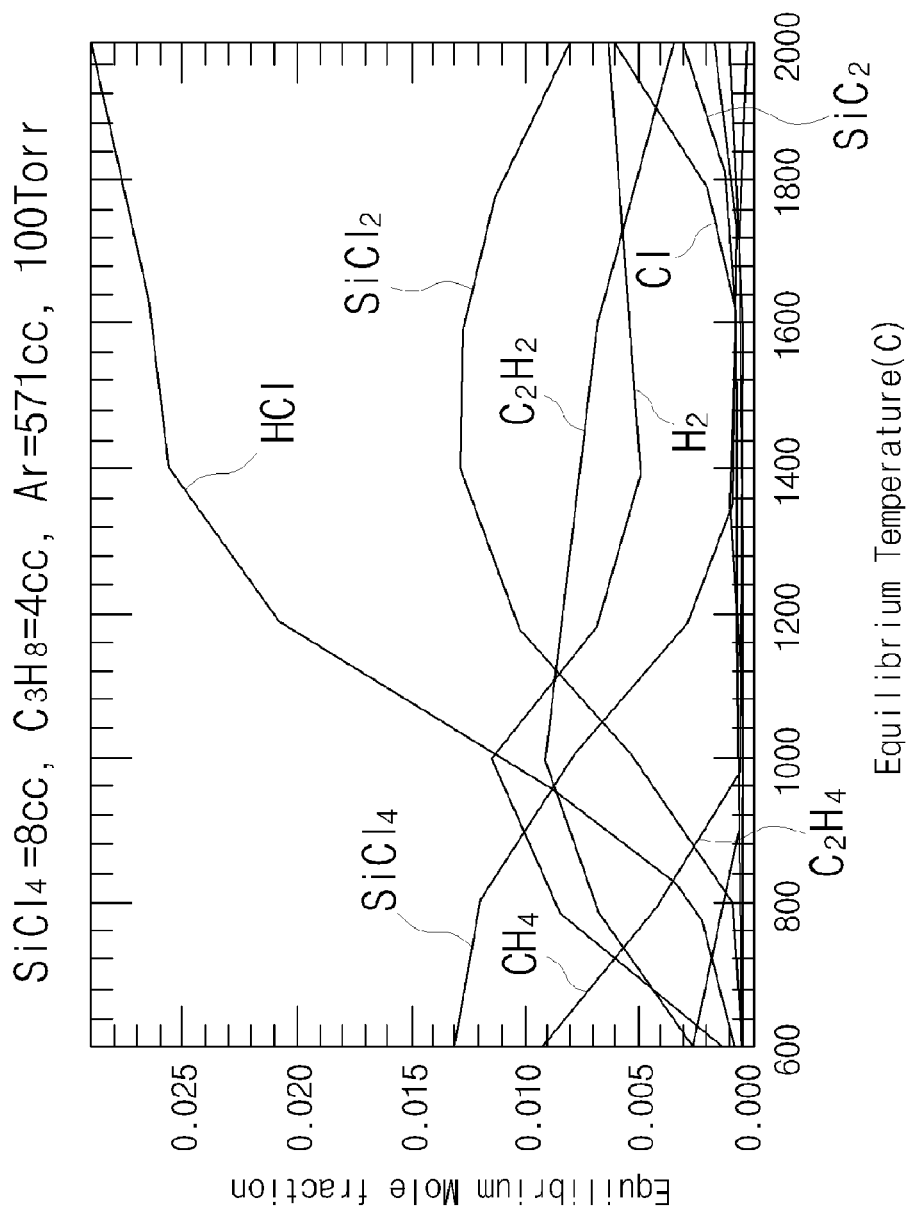
FIG. 16 is a graph showing an equilibrium state of temperatures under a gas supply condition of a reference example.
Figure 17:
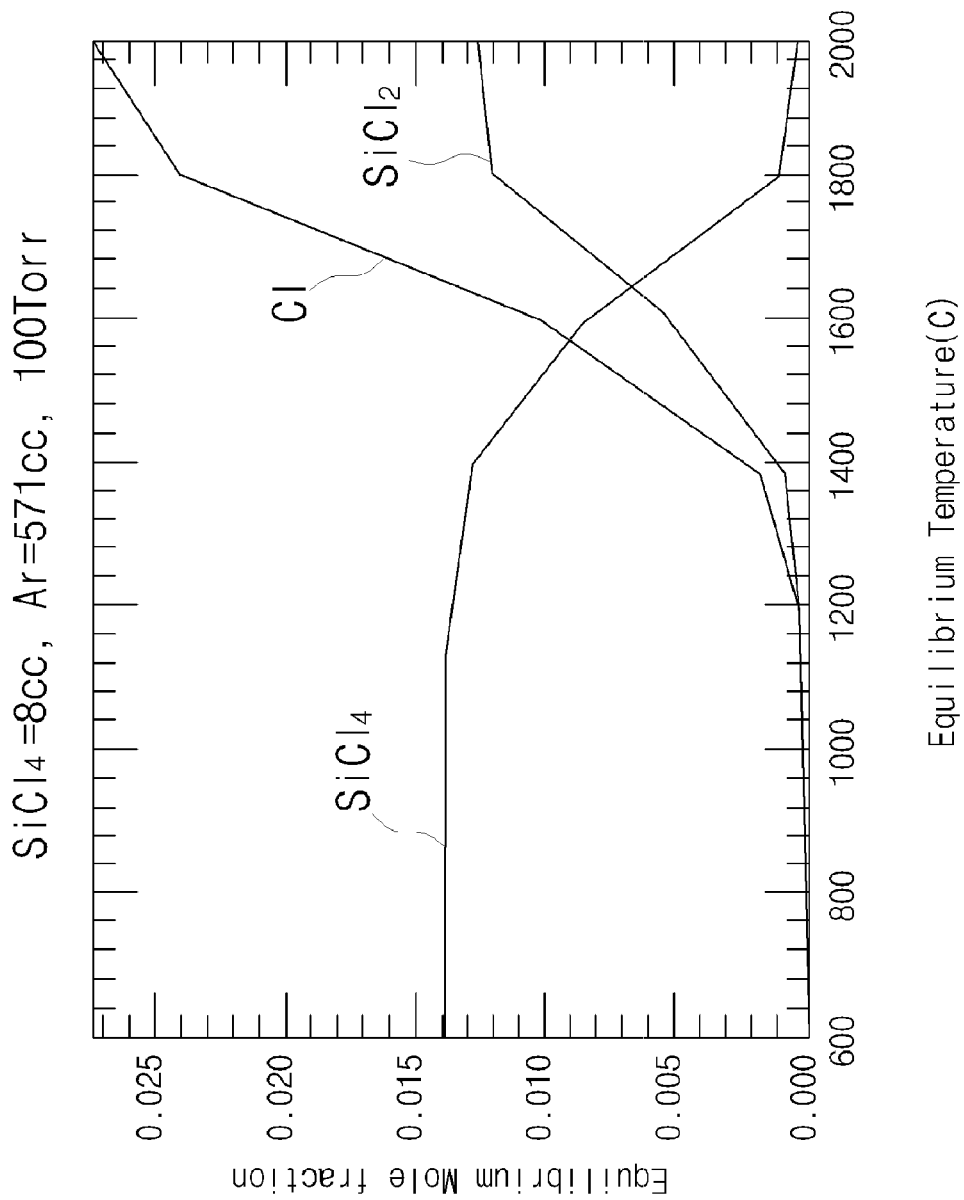
FIG. 17 is a graph showing an equilibrium state of temperatures under a gas supply condition of embodiments of the present invention.

In order to solve these problems, the inventor(s) of the present invention performed calculations shown in FIGS. 16 and 17. FIG. 16 is a reference example to be compared with the present invention, and shows a chemical equilibrium state of temperatures when $SiCl_4$ gas is supplied as the gas containing Si and Cl, $C_3H_8$ gas is supplied as the carbon-containing gas, and Ar gas is supplied as the rare gas acting as the carrier gas at a ratio of $SiCl_4$ gas:$C_3H_8$ gas:Ar gas=8:4:571. At this time, flow rates of gas species were as follows: 8.0 sccm of $SiCl_4$ gas, 4.0 sccm of $C_3H_8$ gas, and 571 sccm of Ar gas. A pressure at this time was 100 Torr. FIG. 16 simulates a state in the gas supply nozzle when $SiCl_4$ gas, $C_3H_8$ gas and Ar gas are supplied using only one gas supply nozzle. Here, the chemical equilibrium state means a state reached when a mole fraction of each gas is provided as an initial condition and the mole fraction is maintained at an initial temperature indefinitely. A horizontal axis represents a temperature in an equilibrium state, and a vertical axis represents a mole fraction generated by the supplied source gases and composition or binding of the supplied source gases. In addition, description of Ar gas is omitted from FIG. 16.

In FIG. 16, in a temperature range of at least 1000° C. to 1600° C., large amounts of HCl gas, $SiCl_2$ gas, $C_2H_2$ gas and $H_2$ gas exist. That is, in the above temperature range at which the SiC epitaxial growth is performed, one gas supply nozzle is installed in the reaction chamber 44 so that, when $SiCl_4$ gas, $C_3H_8$ gas and Ar gas are supplied, the HCl gas, $SiCl_2$ gas, $C_2H_2$ gas, and $H_2$ gas are generated in the gas supply nozzle. For example, when the temperature of the equilibrium state is 1400° C., large amounts of gases are generated in an order of HCl gas, $SiCl_2$ gas, $C_2H_2$ gas and $H_2$ gas. In addition, as $SiCl_2$ gas and $C_2H_2$ gas react with each other, a polycrystalline film of SiC(SiC-Poly) is anticipated to be formed in the gas supply nozzle.

At this time, HCl gas for an etching operation also exists. However, since HCl gas has a small etching effect on SiC at a temperature of 1500° C. or less, a polycrystalline film of SiC grows. In addition, particles may be generated due to blocking of the gas supply nozzle or peeling of the polycrystalline film of SiC.

In order to solve the problems, the inventor(s) of the present invention performed calculations shown in FIG. 17. FIG. 17 shows an equilibrium state of temperatures under a gas supply condition of the embodiment of the present invention, showing a calculation result when the carbon-containing gas is excluded from the condition of FIG. 16. FIG. 17 shows the equilibrium state of temperatures when $SiCl_4$ gas is supplied as a gas containing Si and Cl, and Ar gas is supplied as a rare gas acting as a carrier gas at a ratio of $SiCl_4$ gas:Ar gas=8:571. Here, flow rates of the gases are as follows: 8.0 sccm of $SiCl_4$ gas and 570 sccm of Ar gas. A pressure is 100 Torr. FIG. 17 simulates a state in the gas supply nozzle when $SiCl_4$ gas and Ar gas are supplied using the first gas supply nozzle. In addition, description of the Ar gas is omitted from FIG. 17.

As shown in FIG. 17, most of the $SiCl_4$ gas is not decomposed at about 1200° C. In the case of FIG. 16, a reduction reaction of the $SiCl_4$ gas is considered to occur due to $H_2$ contained in the $C_3H_8$ gas. In contrast, in FIG. 17, since there is no $C_3H_8$ gas, most of the $SiCl_4$ gas is considered not to be decomposed at about 1200° C. In addition, since it is already known that the $SiCl_4$ gas as a single gas is not a gas that contributes to forming the SiC film, deposition such as the polycrystalline film of SiC in the gas supply nozzle is considered not to be easily generated at least about 1200° C.

In addition, when the temperature is 1200° C. or more, the $SiCl_4$ gas is decomposed to generate $SiCl_2$ gas and $Cl_2$ gas. For example, a polycrystalline film of SiC is anticipated to be formed by the $SiCl_2$ gas. However, in this case, since the $Cl_2$ gas having an etching effect is also generated, there is considered to be no deposition of the film in the gas supply nozzle. Further, since there is no $H_2$ in the nozzle and there is no film forming reaction such as $SiCl_2+H_2 \rightarrow Si(Solid)+2HCl$, the film cannot be easily stuck to an inside of the nozzle.

That is, as at least the silicon-containing gas and the chlorine-containing gas are supplied through the first gas supply nozzle 60 and at least the carbon-containing gas and the reduction gas are supplied through the second gas supply nozzle 70, consumption of the supplied gas in the gas supply nozzle may be suppressed, blocking in the gas supply nozzle may be suppressed, and thus, generation of particles may be prevented.

Preferably, a silicon-containing gas, a chlorine-containing gas and a rare gas acting as a carrier gas, for example, Ar gas, may be supplied through the first gas supply nozzle 60, and a carbon-containing gas and a reduction gas, for example, $H_2$ gas, may be supplied through the second gas supply nozzle 70.

In addition, preferably, a gas containing Si and Cl, for example, $SiCl_4$ gas, and a carrier gas, for example, a rare gas such as Ar gas, may be supplied through the first gas supply nozzle 60, and a carbon-containing gas and a reduction gas, for example, $H_2$ gas, may be supplied through the second gas supply nozzle 70.

Further, when impurities are added, the gas supply system may have the following configuration. In the second gas supply port 68, a gas that dopes at least n-type impurities, i.e., an n-type impurity gas, for example, nitrogen ($N_2$) gas, is supplied through the second gas supply nozzle 70. The second gas supply port 68 is made of, for example, carbon graphite. The second gas supply nozzle 70 is installed inside the object to be heated 48 in the reaction chamber 44. The second gas supply nozzle 70 is installed at the manifold to pass through the manifold. In addition, the second gas supply nozzle 70 may be installed in plural.

The second gas supply nozzle 70 is connected to the second gas line 260. The second gas line 260 is connected to, for example, a $N_2$ gas source 210*f* via an MFC 211*f* and a valve 212*f* as a flow rate controller (flow rate control means) to supply $N_2$ gas.

According to this configuration, a flow rate, concentration and partial pressure of the n-type impurity gas, for example, $N_2$ gas, in the reaction chamber 44 may be controlled. The valve 212*f* and the MFC 211*f* are electrically connected to the gas flow rate control unit 78. The gas flow rate control unit 78 controls the valve 212*f* and the MFC 211*f* at predetermined timings such that the flow rate of the gas becomes a predetermined flow rate (see FIG. 4). For example, the $N_2$ gas source 210*f*, the valve 212*f*, the MFC 211*f*, the gas line 260, the gas supply nozzle 70 and the at least one gas supply port 72 installed at the gas supply nozzle 70 constitute a third gas supply system as a gas supply system.

In addition, in the above embodiment, while $N_2$ gas is exemplified as the n-type impurity gas, it is not limited thereto but a nitrogen-containing gas such as ammonia ($NH_3$) gas may be used. In addition, these gases may be combined and used. $N_2$ gas is an inert gas under an $H_2$ atmosphere. $N_2$ gas may be easily used when an n-type doped SiC film having a doping amount of, for example, $10^{15}$ cm$^{-3}$ to $10^{18}$ cm$^{-3}$, is formed. Further, $NH_3$ gas is an example of a nitrogen-containing gas that may be easily decomposed in a gas phase. A doping amount of impurities in the SiC film may be controlled using a mixed gas including a $N_2$-containing gas or an $NH_3$-containing gas, for example, a mixture of $NH_3$ gas and $N_2$ gas.

In addition, in this embodiment, a method of forming a SiC epitaxial film to which n-type impurities are doped on the wafer 14, which is a substrate, using an n-type impurity gas is described. However, when the SiC film to which p-type impurities are doped is formed, a silicon-containing gas, a chlorine-containing gas, and a p-type impurity gas, i.e., a gas containing p-type impurities, may be supplied through the first gas supply nozzle. As a result, as mentioned in the following detailed description, the SiC epitaxial film to which p-type impurities are uniformly doped may be formed.

Further, in order to supply a gas to each of the plurality of wafers 14, the first gas supply port 68 and the second gas supply port 72 may be installed in the first gas supply nozzle 60 and the second gas supply nozzle 70 to correspond to each of the wafers 14 disposed at an arrangement region of the substrates. The plurality of wafers 14 are the plurality of substrates concentrically aligned on the boat 30 in a horizontal posture to be vertically stacked and held. Accordingly, uniformity in surface of a film thickness and uniformity in surface of impurity concentration of the film formed on each of the wafers 14 may be easily controlled.

However, the present invention is not limited thereto, in the first gas supply nozzle 60 and the second gas supply nozzle 70, at least one first gas supply port 68 and at least one second gas supply port 72 may be installed at the arrangement region of the substrates. In addition, in each of the first gas supply nozzle and the second gas supply nozzle, the first gas supply port 68 and the second gas supply port 72 may be installed at the arrangement region of the substrates to correspond to several sheets of wafers.

In addition, in this embodiment, a silicon-containing gas and a chlorine-containing gas are supplied through the first gas supply nozzle 60, and a carbon-containing gas, a reduction gas and an n-type impurity gas are supplied through the second gas supply nozzle 70. However, the present invention is not limited thereto but may include gas supply nozzles installed to correspond to gas species.

Further, as an inert gas, a rare gas such as Ar gas is supplied into the reaction chamber 44 through the third gas supply port 360. In a state in which a degree of opening of an MFC 211*e* is adjusted and a valve 212*e* is opened to correspond to a predetermined flow rate, Ar gas is supplied from a gas supply source 210*e* through a gas supply pipe 240. As the inert gas supplied through the third gas supply port 360, the rare gas such as Ar gas passes through a space between the insulating material 54 and the reaction tube 42 in the reaction chamber 44 and is discharged from the second gas exhaust port 390.

Furthermore, while Ar gas is exemplified as the inert gas in this embodiment, the embodiment is not limited thereto but at least one rare gas such as He gas, Ne gas, Kr gas, Xe gas, etc., or at least two gases selected from the group consisting of the rare gases may be supplied.

In addition, in this embodiment, the silicon-containing gas, carbon-containing gas, reduction gas and n-type impurity gas are supplied into the object to be heated 48 through the first gas supply port or the second gas supply port. However, for example, a rare gas, for example, Ar gas, may be supplied as a carrier gas therewith. Accordingly, the source gas may be uniformly supplied into the reaction chamber.

Further, as shown in FIG. 3, the first gas exhaust port 90 is disposed at a surface opposite to a position of the gas supply nozzle 60 connected to the first gas supply port 68 and the gas supply nozzle 70 connected to the second gas supply port 72. A gas exhaust pipe 230 connected to the first gas exhaust port 90 is installed at the manifold to pass through the manifold. A vacuum exhaust apparatus 220 such as a vacuum pump is connected to a downstream side of the gas exhaust pipe 230. The vacuum exhaust apparatus 220 such as the vacuum pump is connected to a downstream side of the gas exhaust pipe 230 via a pressure sensor serving as a pressure detector (not shown) and an automatic pressure controller (hereinafter, referred to as APC) valve 214 serving as a pressure regulator. The pressure sensor and the APC valve 214 are electrically connected to a pressure controller 98. The pressure controller 98 controls the APC valve 214 at predetermined timings such that a pressure in the processing furnace 40 becomes a predetermined pressure by adjusting a degree of opening of the APC valve 214 based on a pressure detected by the pressure sensor (see FIG. 4).

Furthermore, as shown in FIG. 3, the third gas supply port 360 is disposed between the reaction tube 42 and the insulating material 54 and installed to pass through the manifold. In addition, the second gas exhaust port 390 is disposed between the reaction tube 42 and the insulating material 54. The second gas exhaust port 390 is disposed at a surface opposite to the third gas supply port 360. The gas exhaust pipe 230 connected to the second gas exhaust port 390 is installed at the manifold to pass through the manifold. As an inert gas, for example, a rare gas such as Ar gas is supplied through the third gas supply port 360 so that intrusion of a gas contributing to the SiC epitaxial film growth, for example, a silicon-containing gas, a carbon-containing gas, a chlorine-containing gas, or a mixed gas thereof between the reaction tube 42 and the insulating material 54 may be prevented, and deterioration of an inner wall of the reaction tube 42 or an outer wall of the insulating material or sticking of byproducts thereto may be suppressed.

The inert gas supplied between the reaction tube 42 and the insulating material 54 is exhausted through the second gas exhaust port 390 by the vacuum exhaust apparatus 220. The inert gas is exhausted via the pressure sensor serving as the pressure detector (not shown) at a downstream side of the gas exhaust pipe 230 and the APC valve (214) serving as the pressure regulator. The pressure control unit is electrically connected to the pressure sensor and the APC valve 214. The pressure control unit adjusts the APC valve 214 based on the pressure detected by the pressure sensor to control the APC valve 214 at predetermined timings such that the pressure in the pressure chamber 44 reaches a predetermined pressure (see FIG. 4).

Hereinafter, a peripheral configuration of a periphery of the processing furnace 40 will be described. FIG. 5 shows a schematic view of the configuration of the processing furnace 40 and the periphery thereof. A seal cap 102 is installed under the processing furnace 40 to hermetically seal a lower end opening of the processing furnace 40 as a lid body for a furnace port. The seal cap 102 is made of a metal, for example, stainless steel, etc. and has a circular disk shape. As a seal material abutting a lower end of the processing furnace 40, an O-ring is installed at an upper surface of the seal cap 102. A rotary mechanism 104 is installed at the seal cap 102. A rotary shaft 106 of the rotary mechanism 104 is coupled to the boat 30 through the seal cap 102 to rotate the boat 30, thus rotating the wafers 14. The seal cap 102 is configured to be vertically raised by a elevation motor 122 to be described later as a lift mechanism directed to an outside of the processing furnace 40, so that the boat 30 may be loaded and unloaded into/from the processing furnace 40. A driving controller 108 is electrically connected to the rotary mechanism 104 and the elevation motor 122. The rotary mechanism 104 and the elevation motor 122 are configured to be controlled to perform a predetermined operation at predetermined timings (see FIG. 4).

A lower base plate 112 is installed at an outer surface of a load lock chamber 110 as a preliminary chamber. A guide shaft 116 fitted to a lift frame 114 and a ball screw 118 threadedly engaged with the lift frame 114 are installed at the lower base plate 112. An upper base plate 120 is installed at upper ends of the guide shaft 116 and the ball screw 118 vertically installed at the lower base plate 112. The ball screw 118 is rotated by the elevation motor 122 installed at the upper base plate 120. As the ball screw 118 is rotated, the lift frame 114 is raised and lowered.

A hollow lift shaft 124 is vertically installed at the lift frame 114. A connection part of the lift frame 114 and the lift shaft 124 is hermetically sealed. The lift shaft 124 is configured to be raised and lowered with the lift frame 114. The lift shaft 124 passes through a ceiling plate 126 of the load lock chamber 110. A through-hole of the ceiling plate 126 through which the lift shaft 124 passes has a substantial margin not to contact the lift shaft 124. A bellows 128, i.e. a hollow flexible body having flexibility, is installed between the load lock chamber 110 and the lift frame 114 to surround the lift shaft 124 to hermetically seal the load lock chamber 110. The bellows 128 has substantial flexibility to cover a lift range of the lift frame 114. An inner diameter of the bellows 128 is substantially larger than an outer profile of the lift shaft 124 and configured not to contact the lift shaft 124 when the bellows 128 is extended and contracted.

A lift base plate 130 is horizontally fixed to a lower end of the lift shaft 124. A driving unit cover 132 is hermetically installed at a lower surface of the lift base plate 130 via the seal member such as the O-ring. The lift base plate 130 and the driving unit cover 132 configure a driving unit accommodating case 134. According to the configuration, an inside of the driving unit accommodating case 134 is isolated from an atmosphere in the load lock chamber 110.

In addition, the rotary mechanism 104 for the boat 30 is installed in the driving unit accommodating case 134. A periphery of the rotary mechanism 104 is cooled by a cooling mechanism 135.

A power cable 138 is guided from an upper end of the lift shaft 124 and connected to the rotary mechanism 104 through a hollow part of the lift shaft 124. In addition, a cooling water flow path 140 is formed in the cooling mechanism 135 and the seal cap 102. A cooling water piping 142 is guided from the upper end of the lift shaft 124 and connected to the cooling water flow path 140 through the hollow part of the lift shaft 124.

As the elevation motor 122 is driven and the ball screw 118 is rotated, the driving unit accommodating case 134 is raised and lowered via the lift frame 114 and the lift shaft 124.

As the driving unit accommodating case 134 is raised, the seal cap 102 hermetically installed at the lift base plate 130 closes a furnace port 144, which is an opening of the processing furnace, and the wafers 14 are in a state to be processed. As the driving unit accommodating case 134 is lowered, the boat 30 is lowered together with the seal cap 102, and the wafers 14 are in a state to be unloaded to the outside.

Figure 4:
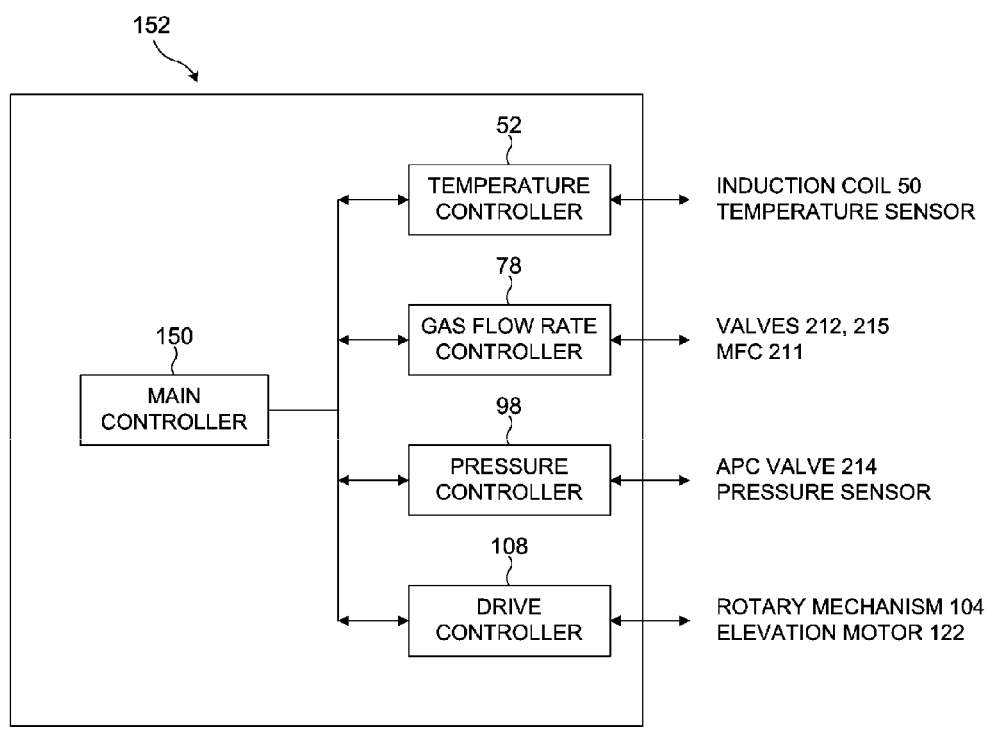
FIG. 4 is a diagram illustrating a control configuration of components constituting the semiconductor manufacturing apparatus 10 according to the first embodiment of the present invention.
Figure 5:
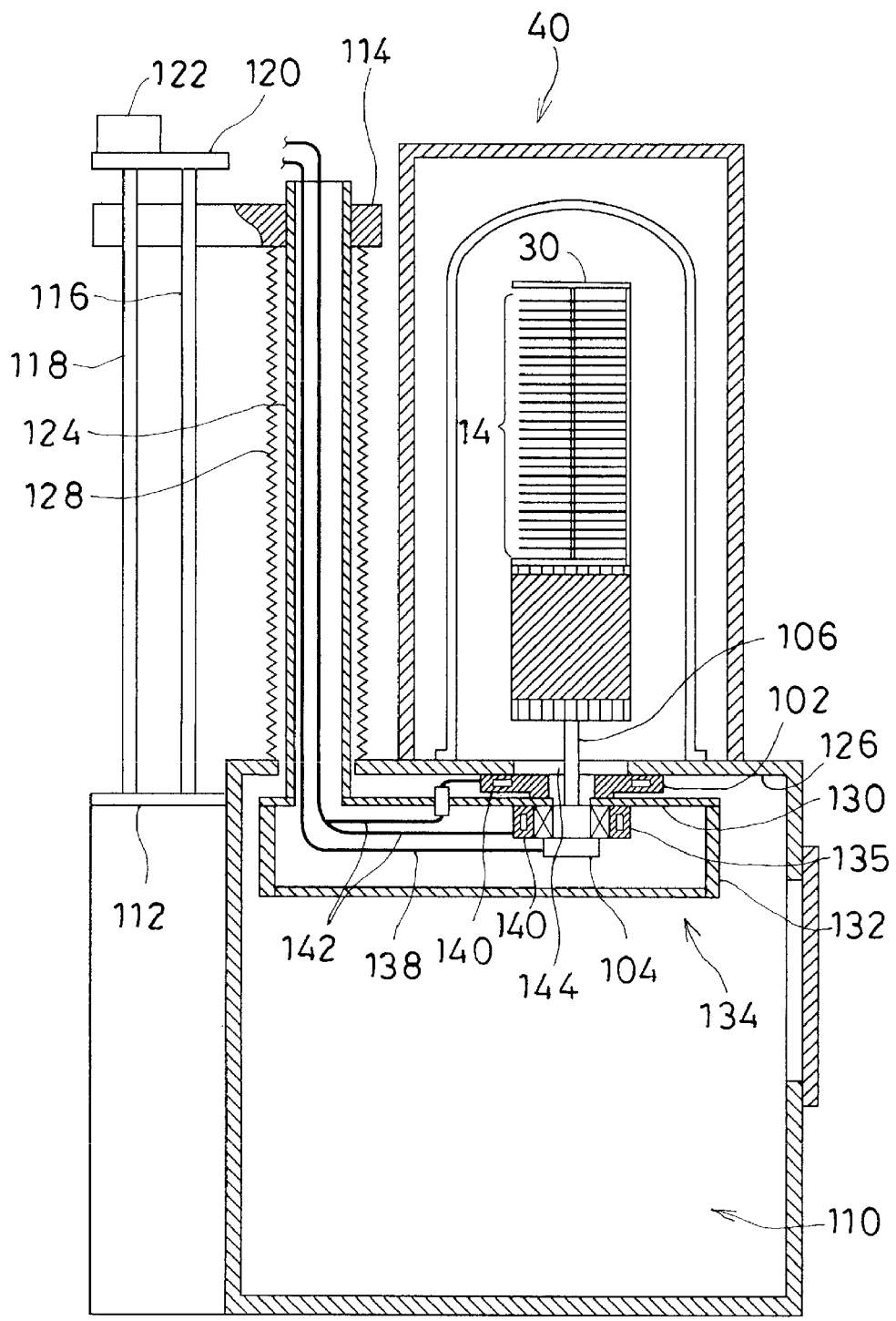
FIG. 5 shows a schematic view of a processing furnace 40 and a peripheral structure of the semiconductor manufacturing apparatus 10 according to the first embodiment of the present invention.

FIG. 4 shows control configurations of components constituting the semiconductor manufacturing apparatus 10 for forming the SiC epitaxial film. The temperature control unit 52, the gas flow rate control unit 78, the pressure controller 98 and the driving controller 108 constitute an operation part and an input/output part. The temperature control unit 52, the gas flow rate control unit 78, the pressure controller 98 and the driving controller 108 are electrically connected to a main control unit 150 configured to control the entire semiconductor manufacturing apparatus 10. The temperature control unit 52, the gas flow rate control unit 78, the pressure controller 98 and the driving controller 108 constitute a controller 152.

As described above, at least the silicon-containing gas and the chlorine-containing gas are supplied through the first gas supply port 68, and at least the carbon-containing gas, the reduction gas and the n-type impurity gas are supplied through the second gas supply port 72. Since the supplied gases flow parallel to the wafers 14 made of Si, SiC, etc. toward the first exhaust port 90, all the wafers 14 may be effectively and uniformly exposed to the gases.

Hereinafter, a method of forming a SiC epitaxial film, to which, for example, n-type impurities are doped, on a substrate such as the wafers 14 made of SiC, etc. using the heat treatment apparatus 10 as described above, will be described as one process of a method of manufacturing a semiconductor device. In addition, in the following description, operations of components constituting the heat treatment apparatus 10 are controlled by the controller 152.

First, when the pod 16 in which the plurality of wafers 14 are accommodated is set on the pod stage 18, the pod conveyance apparatus 20 conveys the pod 16 from the pod stage 18 and stores the pod 16 in the pod storage apparatus 22. Next, the pod conveyance apparatus 20 conveys and sets the pod 16 stored in the pod storage apparatus 22 to the pod opener 24. The pod opener 24 opens the lid of the pod 16, and the substrate number detector 26 detects the number of wafers 14 accommodated in the pod 16.

Thereafter, the substrate transfer apparatus 28 takes out the wafers 14 from the pod 16 disposed at a position of the pod opener 24 and transfers the wafers 14 into the boat 30.

When the plurality of wafers 14 are charged into the boat 30, the boat 30 in which the plurality of wafers 14 are held is loaded into the reaction chamber 44 by a lift operation of the lift frame 114 and the lift shaft 124 by the elevation motor 122 (boat loading). In this state, the seal cap 102 seals the lower end of the manifold via the O-ring.

The vacuum exhaust apparatus 220 vacuum-exhausts the inside of the reaction chamber 44 until the inside of the reaction chamber 44 becomes a predetermined pressure (vacuum level). At this time, the pressure in the reaction chamber 44 is measured by the pressure sensor. The APC valve 214 in communication with the first gas exhaust port 90 and the second gas exhaust port 390 is feedback-controlled based on the measured pressure. In addition, the wafers 14 and the inside of the object to be heated 48 are heated by the objected to be heated 48 induction-heated by the induction coil 50 serving as the magnetic field generating part to a predetermined temperature. At this time, a state of conduction to the induction coil 50 is feedback-controlled based on the temperature information detected by the temperature sensor until the inside of the object to be heated 48 reaches a predetermined temperature distribution. Then, as the boat 30 is rotated by the rotary mechanism 104, the wafers 14 are rotated in a circumferential direction thereof.

Next, the silicon-containing gas and chlorine-containing gas that contribute to a growth reaction of the SiC epitaxial film to which n-type impurities are doped are supplied from the gas sources 210a and 210b to the gas supply port 68, respectively. In addition, the carbon-containing gas, $H_2$ gas, which is a reduction gas, and n-type impurity gas are supplied from the gas sources 210a, 210d and 210f to the gas supply port 72 such that the SiC film to which n-type impurities are doped is formed by the epitaxial growth.

At this time, in a state in which the degrees of opening of the MFCs 211a and 211b corresponding to a predetermined flow rate are adjusted and then the valves 212a and 212b are opened, the silicon-containing gas and chlorine-containing gas are supplied through the first gas supply port 68 via the gas supply pipe 222 and the first gas supply nozzle 60, respectively. In addition, in a state in which the degree of opening of the MFCs 211c, 211d and 211f corresponding to a predetermined flow rate is adjusted and the valves 212c, 212d and 212f are opened, the carbon-containing gas, reduction gas and n-type impurity gas are supplied through the second gas supply port 72 via the gas supply pipe 160 and the second gas supply nozzle 70, respectively.

The gases supplied through the first gas supply port 68 and the second gas supply port 72 are exhausted through the inside of the object to be heated 48 in the reaction chamber 44, the gas exhaust port 90 and the gas exhaust pipe 230. When the gases supplied through the first gas supply port 68 and the second gas supply port 72 pass through the inside of the object to be heated 48, the gases contact the wafers 14 made of SiC, etc., and the SiC epitaxial films to which n-type impurities are doped grow on surfaces of the wafers 14.

As the inert gas and rare gas, the Ar gas is supplied into the reaction chamber 44 from the gas supply source 210e through the gas supply port 240 and the third gas supply port 360, in a state in which the degree of opening of the MFC 211e corresponding to a predetermined flow rate is adjusted and then the valve 212e is open. As the inert gas and rare gas supplied through the third gas supply port 360, the Ar gas passes between the insulating material 54 and the reaction tube 42 in the reaction chamber 44, and is exhausted through the second gas exhaust port 390.

FIG. 6 shows an example of the gas supply nozzle according to this embodiment. A first branch nozzle disposed in a direction parallel to surfaces of the wafers 14 and extending and branched in a direction of the second gas supply port 70 is installed at the first gas supply nozzle 60 extending to a region in which the wafers 14, which are substrates, are arranged. The silicon-containing gas and chlorine-containing gas are supplied through the at least one first gas supply port 68 installed at the first branch nozzle. A second branch nozzle disposed in a direction parallel to the surfaces of the wafers 14 and extending and branched in a direction of the first gas supply port 60 is installed at the second gas supply nozzle 70 installed at a different position from the first gas supply nozzle and extending to a region in which the wafers 14 are arranged. The carbon-containing gas, n-type impurity gas, for example, $N_2$ gas, and a reduction gas, for example, $H_2$ gas, are supplied through the at least one second gas supply port 72 installed at the second branch nozzle. Accordingly, the SiC films to which n-type impurities are doped are formed on the wafers 14.

Figure 6C:
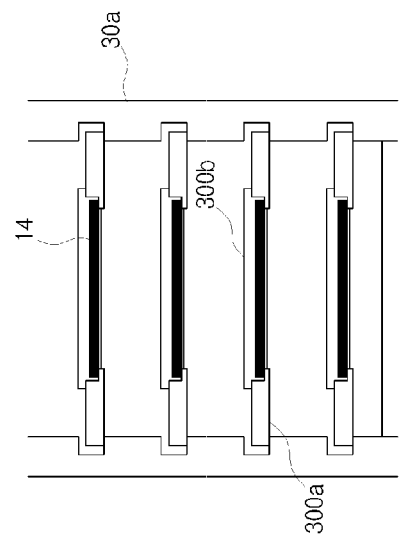
FIG. 6 exemplifies a shape of a gas supply nozzle in a configuration of a reaction chamber according to the first embodiment of the present invention.
Figure 6B:
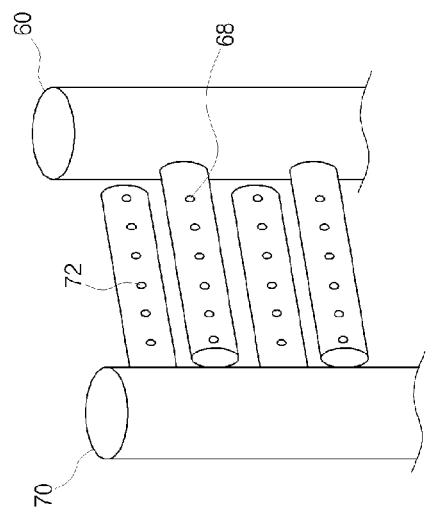
Figure 6A:
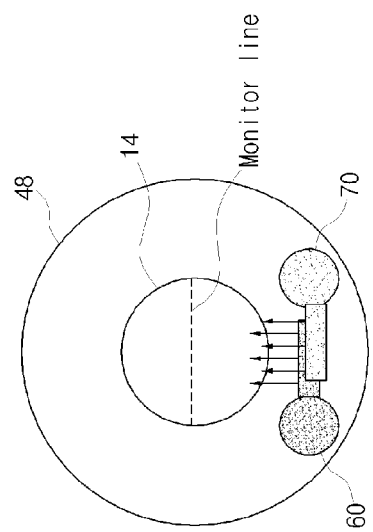

As shown in FIG. 6A, since the gas may be supplied in a direction parallel to the wafers 14, a film thickness of the SiC films formed on the wafers 14 is uniform, and $N_2$ impurities may be uniformly doped. In particular, as the gas is supplied via a first branch pipe and a second branch pipe shown in FIG. 6B, influence due to a plurality of boat posts 30a configured to support the wafers 14 may be reduced. Detailed description is as follows. The wafers 14, which are rotated to uniformize the film thickness in the surfaces thereof, are supported by the plurality of boat posts 30a. Then, the boat posts 30a pass in front of the gas supply port. In this case, while the gas supply is disturbed by the boat posts 30a, as a plurality of gas supply ports are installed in a direction parallel to the wafers 14 as shown in FIG. 6, the gas supply may be widely or precisely realized and influence due to the boat posts 30a may ultimately be reduced.

In addition, in order to reduce the influence due to the boat posts 30a, as shown in FIG. 6C, the wafers 14 may be separated from the boat posts 30a using wafer holders 300. Each of the wafer holders 300 includes a first wafer holder 300a having a ring shape. The wafer 14 is held on the first wafer holder 300a. Accordingly, a distance between the wafer 14 and the boat posts 30a may be determined by the wafer holder 300a, and influence due to the boat posts 30a may be reduced. In addition, an upper surface of the wafer 14 is covered by the first wafer holder 300a using a face-down method for forming a film in the embodiment. As the upper surface of the wafer 14 is covered as described above, influence due to particles dropped from an upper side thereof may be suppressed, and as the first wafer holder 300a is in contact with the upper surface of the wafer 14, film-forming onto a back surface of the wafer 14 opposite to the film-forming surface may be suppressed.

Further, preferably, the first branch nozzle and the second branch nozzle may be installed to be alternately disposed. Accordingly, concentration distribution of the silicon-containing gas and chlorine-containing gas supplied from the first gas supply nozzle, and the carbon-containing gas, $N_2$ gas, which is the n-type impurity gas, and $H_2$ gas, which is the reduction gas, supplied from the second gas supply nozzle may be uniformized on a monitor line (a direction perpendicular to a gas flow).

Furthermore, the pair of the first branch nozzle and second branch nozzle may be disposed between the wafers 14, which are arranged in a height direction thereof. Accordingly, the wafers 14 may be provided under the same condition, and uniformity between the wafers may be improved. In addition, in this case, the film-forming surfaces of the wafers 14 may be disposed adjacent to the first gas supply port 68 configured to supply the silicon-containing gas in the first gas supply port 68 and the second gas supply port 72. In forming the SiC film, a ratio of carbon (C) and Si (C/Si) is important. In particular, when the concentration of C is high, a film quality is deteriorated. Accordingly, in order to form an environment conducive to Si richness, the first gas supply port 68 through which the silicon-containing gas is supplied may be disposed nearer to the film-forming surfaces of the wafers 14 than the second gas supply port 72 through which C atom-containing gas is supplied. For this reason, in this embodiment, the first branch nozzle and the second branch nozzle are sequentially arranged in a space between the wafers 14.

In addition, as shown in FIG. 6, when the configuration of supplying the gas through the first branch nozzle and the second branch nozzle extending in a direction parallel to the wafers is used, as a mixing place of the gas supplied through the first branch nozzle and the gas supplied through the second branch nozzle is controlled, the C/Si ratio on the film-forming surfaces of the wafers 14 in a direction perpendicular to the monitor line (a gas flow direction) shown in FIG. 6A may be uniformized Hereinafter, a line on the film-forming surfaces perpendicular to the monitor line shown in FIG. 6A will be specifically described as a second monitor line. First, the silicon-containing gas and carbon-containing gas are assumed to be supplied starting at a ratio (C/Si) of 0.5. When the silicon-containing gas and carbon-containing gas are completely mixed before the gases reach the wafers 14, the C/Si on the second monitor line is uniform at 0.5, gas consumption is not considered.

However, in consideration of the gas consumption, since the silicon-containing gas and carbon-containing gas are equally consumed, a mixing ratio is varied from a near side to a far side from the gas supply nozzle. For example, provided that the Si atom-containing gas of 100 and the C atom-containing gas of 50 are supplied, the Si atom-containing gas and C atom-containing gas are equally consumed and reduced as the gases move from the gas supply port. Here, although this is an extreme example, if the Si atom-containing gas is consumed to 60, the C atom-containing gas is consumed to 10. The C/Si at this time becomes 10/60=0.17 and the C/Si ratio is varied from the near side to the far side from the gas supply nozzle.

Meanwhile, when the Si atom-containing gas and C atom-containing gas are controlled to be slowly mixed on the second monitor line, rather than completely mixed before the gases reach the wafers 14, the SiC from the near side to the far side from the gas supply nozzle may be uniformized This will be described later.

First, when the two gases are supplied in parallel as described in this embodiment, the two gases are diffused and then mixed. Accordingly, the gas supplied through the second branch nozzle is diffused to a flow of the gas supplied through the first branch nozzle near the second monitor line. For this reason, provided that the gas is not consumed during diffusion, concentration of the gas supplied through the second branch nozzle on the second monitor line is increased as it moves from the branch nozzle. Meanwhile, when the gas consumption is considered, in order to uniformize the C/Si values, reduction in the C atom-containing gas may be small in comparison with reduction in the Si atom-containing gas on the second monitor line. Accordingly, when the C atom-containing gas gradually supplied through the second branch nozzle by diffusion is diffused to a flow of the Si atom-containing gas supplied through the first branch nozzle, the C atom-containing gas is supplemented on the second monitor line by the diffusion. As a result, reduction in C atom-containing gas may be reduced in comparison with reduction in Si atom-containing gas.

In order to diffuse the gas supplied through the second branch nozzle into the flow of the gas supplied through the first branch nozzle, a flow velocity of the gas supplied through the first gas supply port 68 may be set such that the gas supplied through the second gas supply port 72 is slowly diffused while passing the film-forming surfaces of the wafers 14. In addition, in general, since another gas cannot be easily diffused when a flow velocity of a gas is increased, it is preferable that the flow velocity of the gas supplied through the first gas supply port is controlled. A method of controlling the flow velocity of the gas supplied through the first gas supply port 68 may be, for example, increasing a flow rate of the carrier gas of the Si atom-containing gas or reducing a size of the first gas supply port 68.

In addition, considering that the Si atom-containing gas and C atom-containing gas are not mixed with each other until the gases reach the wafers 14, the case that the wafer holders 300 as shown in FIG. 6C are used is more effective. That is, when the Si atom-containing gas and C atom-containing gas are mixed with each other before the gases reach the wafers 14, the SiC film is formed on the wafer holders 300. The fact that the SiC film is formed means that efficiency of the source gas is deteriorated. Meanwhile, when the mixing is started on the wafers 14, since the film is not formed on the wafer holders 300, the source gas is not consumed. Accordingly, use efficiency of the source gas may be improved, and in other words, a film-forming rate may be improved and thus productivity may be improved.

Further, while the gas supply port shown in FIG. 6 has a plurality of gas supply ports having a hole shape, the gas supply ports are not limited thereto but may have slit shapes.

In the SiC film formed according to the conventional art, a portion having a high Si concentration (a Si-rich portion) and a portion having a high C concentration (a C-rich portion) are generated, and thus, deviation in a concentration ratio C/Si of Si and C of the formed SiC film is generated. Film quality of the SiC film largely depends on a value of the concentration ratio C/Si. Accordingly, when the deviation occurs, the film quality in the surfaces of the wafers 14 cannot be easily maintained. However, the plurality of gas supply ports are installed in the direction parallel to the wafers 14 by the branch pipe as described in the embodiment, and thus, the C/Si value in the surface may be uniformized. In addition, when deviation in the concentration ratio C/Si occurs, impurity doping is also affected. Accordingly, the embodiment is preferable even when the impurity doping is performed.

Hereinafter, a method of further uniformizing the impurity doping will be described. For example, while $N_2$ gas is supplied into the reaction chamber 44 to dope $N_2$ as n-type impurities in the surface of the SiC film, $N_2$ may be easily taken in a Si site to which C is to be adsorbed. In addition, in the C-rich portion, since a larger amount of C is adsorbed to the Si site or occupies the Si site, absorption of $N_2$ is disturbed and doping concentration is lowered. Accordingly, characteristics of the film formed according to a doping amount of the impurities, for example, an electric resistance rate, are considered not to be easily controllable.

Here, $N_2$ gas is supplied as the impurity gas through the second gas supply port together with a carbon-containing gas using a site competition theory, which will be described later, and thus, distribution of the impurity concentration in the surfaces of the SiC films, to which n-type impurities are doped, formed on the wafers 14, for example, the SiC films, to which $N_2$ is doped, is uniformized.

Hereinafter, the site competition theory will be described. It is known that when impurities are taken in the SiC film, the impurities are taken in any one of the C site and Si site. When n-type impurities, for example, $N_2$ gas, is doped, the $N_2$ gas is adsorbed to the Si site of the SiC film to be substituted with C, which is to be taken in the SiC film, so that the $N_2$ is taken in the SiC film to form the SiC film to which the n-type impurities are doped. In addition, when p-type impurities, for example, aluminum (Al), are doped, Al is adsorbed to a C side of the SiC film to be substituted with Si, which is to be adsorbed to the SiC film, so that Al is taken in the SiC film to form the SiC film to which the p-type impurities are doped. The above description is known as site competition theory.

In this embodiment, when the SiC film to which the n-type impurities are doped is formed, the $N_2$ gas is supplied as the n-type impurities together with the silicon-containing gas, carbon-containing gas and chlorine-containing gas, which are source materials of the SiC film. As described above, deviation in distribution of the ratio of Si and C(C/Si) in the surfaces of the SiC films occurs. $N_2$ competing between the C and Si sites is taken in a film in which a Si-rich portion is larger than a C-rich portion, and thus, deviation in distribution of the impurity concentration in the surfaces occurs. Here, a mixed gas including a gas competing for the same adsorption site as the impurity gas is supplied, that is, the N2 gas is supplied together with the carbon-containing gas, a larger amount of n-type impurity gas is supplied to the C-rich portion, and thus, an amount of the n-type impurities doped to the Si-rich portion and an amount of the n-type impurities doped to the C-rich portion are relatively uniformized.

In addition, when the SiC film to which the p-type impurities are doped is formed, the p-type impurities, for example, a gas containing Al, are supplied together with the silicon-containing gas to uniformize distribution of the p-type impurities in the surfaces.

This is because the p-type impurities are adsorbed to the C site when the p-type impurities are taken in the SiC film, and compete with Si, which is to be equally adsorbed to the C site. As a large amount of p-type impurity gas is supplied to the Si-rich portion, an amount of the p-type impurities doped to the Si-rich portion and an amount of p-type impurities doped to the C-rich portion are relatively uniformized.

As described above, as the distribution of the impurity concentration in the surfaces of the formed SiC film is uniformized, an electric resistance rate controlled by the impurity concentration may be easily controlled.

Figure 10:
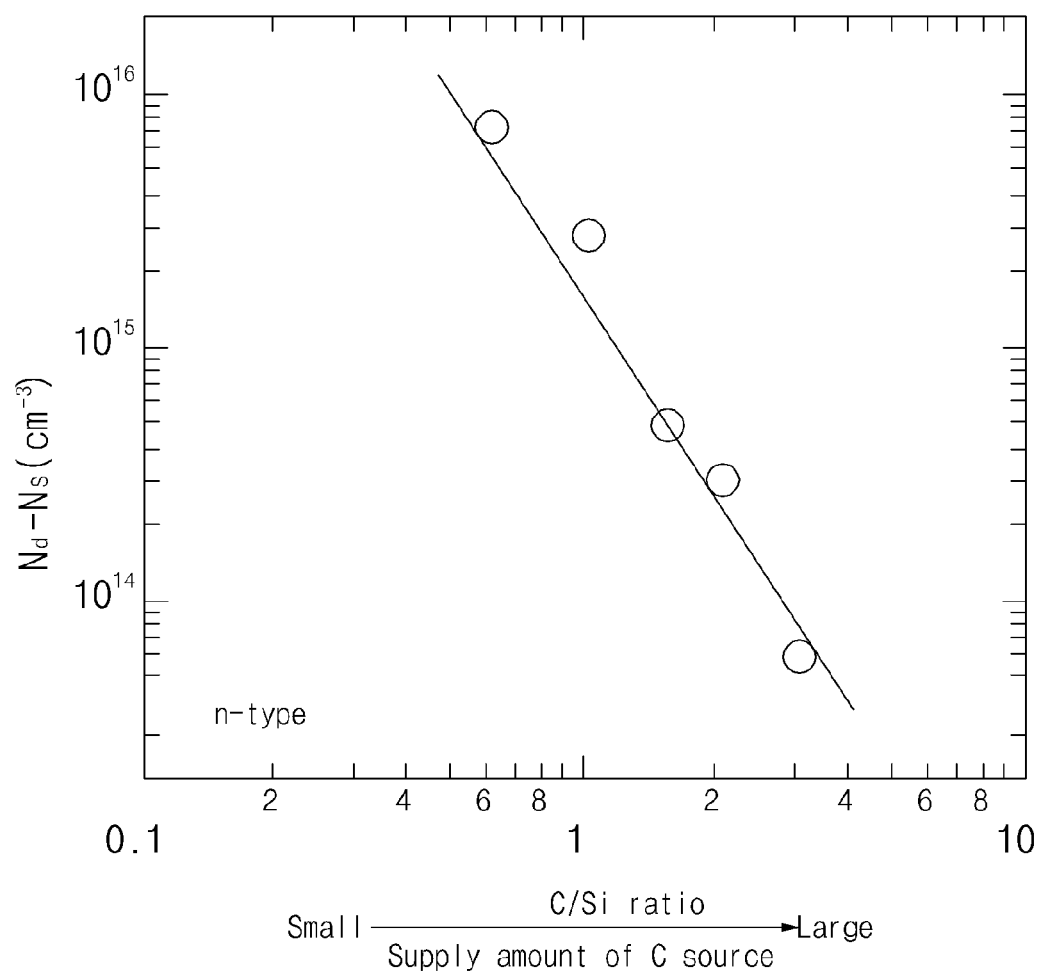
FIG. 10 shows a relationship between C/Si values and donor atom concentrations of a SiC film to which n-type impurities are doped.
Figure 11:
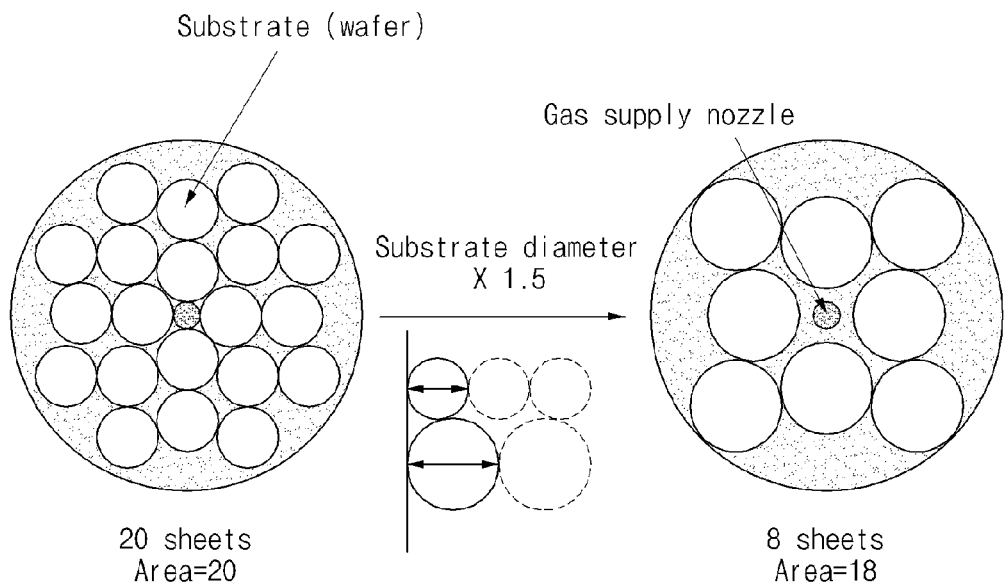
FIG. 11 schematically shows a position relationship between a pancake-type susceptor structure and substrates.

FIG. 10 shows a relationship between a ratio C/Si of concentration distribution of the carbon-containing gas and concentration distribution of the silicon-containing gas, which are major elements of the film-forming contribution gas, and n-type doping atoms doped to the SiC film (recited from "Fundamentals and Applications of SiC Semiconductor," Okumura Hajime, Kojima Kazutoshi, Fukuda Kenji, Published by ED Research, Page 27, FIGS. 4 and 5). From this, it will be appreciated that, when the C/Si value of the source gas is increased, doping of the n-type impurities in the SiC film is disturbed. From the above, in order to uniformize $N_2$ concentration in the SiC film, to which the n-type impurities are doped, in the surface distribution of the wafer 14, it is preferable that deviation in C/Si value in respective portions of the SiC film formed on the wafer 14 is small.

Otherwise, in order to form the SiC film to which the n-type impurities are doped, when the n-type impurity gas, for example, $N_2$ gas, is supplied, or in order to form the SiC film to which the p-type impurities are doped, when the p-type impurity gas, for example, trimethyl aluminum gas, is supplied, it will be appreciated that research on a method of supplying impurities is needed.

In consideration of the above description, the inventor(s) of the present invention invented the method of supplying the n-type impurity gas or the p-type impurity gas when the SiC film to which the n-type impurities or the p-type impurities are doped is formed. For example, when the SiC film to which the n-type impurities are doped is formed, as the n-type purity gas, for example, $N_2$ gas, is supplied together with the carbon-containing gas through the second gas supply nozzle through which the carbon-containing gas is supplied, the $N_2$ gas is actively supplied to a portion of the wafer 14 having a large C/Si value, i.e., a relatively large C concentration to form a state in which the $N_2$ concentration is relatively high. Accordingly, by promoting substitution of $N_2$ in the C site, relative $N_2$ concentration distribution with the portion of the wafer 14 having a small C/Si value may be uniformized.

Therefore, uniformity of concentration distribution of the n-type impurities in the surfaces of the SiC film, to which the n-type impurities are doped, formed on the wafer 14 may be improved.

Meanwhile, when the SiC film to which the p-type impurities are doped is formed, the p-type impurity gas, for example, trimethyl aluminum gas, is supplied together with the silicon-containing gas through the first gas supply nozzle through which the silicon-containing gas is supplied. Accordingly, the trimethyl aluminum gas is actively supplied to the portion of the wafer 14 having a small C/Si value, i.e., a relatively large Si concentration, to increase Al concentration, promoting substitution of Al to the Si site. Therefore, relative aluminum concentration distribution with the portion of the wafer 14 having a large C/Si value may be uniformized As a result, uniformity of the concentration distribution of the p-type impurity in the surface of the SiC film, to which the p-type impurities are doped, formed on the wafer 14 may be improved.

Upon growth of the SiC epitaxial film, when a preset time elapses, supply of the gas is stopped, and an inert gas is supplied from an inert gas supply source (not shown), substituting the inert gas with the inside of the reaction chamber 44. Accordingly, a pressure in the object to be heated 48 is recovered to a normal pressure.

Thereafter, the seal cap 102 is lowered by the elevation motor 122 to open the lower end of the manifold, and the processed wafers 14 held by the boat 30 are unloaded from the lower end of the manifold to the outside of the reaction tube 42 (boat unloading). Next, the boat 30 stands by at a predetermined position until all the wafers 14 supported by the boat 30 are cooled. Next, when the wafers 14 in the boat 30 on standby are cooled to a predetermined temperature, the wafers 14 are discharged from the boat 30 by the substrate transfer apparatus 28 and transferred to the pod 16, which is empty, and set on the pod opener 24 to be accommodated therein. Next, the pod 16 in which the wafers 14 are accommodated is conveyed to the pod storage apparatus 22 or the pod stage 18 by the pod conveyance apparatus 20. As a result, a series of operations of the semiconductor manufacturing apparatus 10 is completed.

In the present invention, growth of an deposition in the gas supply nozzle is suppressed. In addition, the silicon-containing gas, carbon-containing gas, chlorine-containing gas, H₂ gas, which is a reduction gas, and impurity gas supplied through the gas supply nozzle are reacted with one another in the object to be heated 48. Accordingly, when the plurality of wafers 14 made of SiC, etc. are concentrically arranged in a horizontal posture and vertically stacked and held, the SiC epitaxial film to which impurities are doped may grow.

Further, preferably, the first gas supply nozzle and the second gas supply nozzle are disposed such that the first and second gas supply ports 68 and 72 can inject the gases toward centers of the wafers 14. Furthermore, the first gas supply nozzle and the second gas supply nozzle may be alternately installed. Accordingly, biased supply of the gas is suppressed, and uniformity in surface of the film thickness is improved.

In addition, in this embodiment, the first gas supply nozzle and the second gas supply nozzle have a cylindrical shape. However, the first gas supply nozzle and the second gas supply nozzle are not limited thereto but may have a prismatic shape or a polygonal shape. Further, preferably, a portion of the gas supply nozzle may have a shape corresponding to an inner circumference of the object to be heated. Accordingly, formation of the film in a gap between the gas supply nozzle and the object to be heated may be suppressed, and probability of generation of particles due to the formed film may be reduced.

In addition, in this embodiment, at least one gas supply port having a hole shape is installed as the first gas supply port 68 and the second gas supply port 72. However, the gas supply port is not limited thereto but may have a slit shape in a direction parallel to the surfaces of the wafers 14. Accordingly, the gas may be supplied in a direction parallel to the wafers 14. Further, in the SiC films, to which impurities are doped, formed on the wafers 14, surface distribution of the film thickness or surface distribution of the impurity concentration may be uniformized.

Furthermore, since the gas supply port has the slit shape so that the flow velocity of the supplied gas may be reduced, the supplied source gas may be substantially reacted.

In addition, in this embodiment, as the inert gas, a rare gas such as Ar gas may be used. However, the inert gas is not limited thereto bur may be He gas, Ne gas, Kr gas, and Xe gas.

Second Embodiment

Hereinafter, the second embodiment will be described. At least one first branch nozzle parallel to the surfaces of the wafers and extending in a direction of the second gas nozzle 70 is installed at the first gas supply nozzle 60. In addition, at least one second branch nozzle parallel to the surfaces of the wafers 14 and extending in a direction of the first gas supply nozzle 60 is installed at the second gas supply nozzle 72 installed at a different position from the first gas supply nozzle. Further, the source gas is supplied through the at least one first gas supply port 68 and second gas supply port 70 installed at the first branch nozzle and the second branch nozzle, respectively. In the first embodiment, uniformity of the film thickness and impurity concentration was improved by the above configuration. However, in the second embodiment, the first and second gas supply nozzles have a three-dimensional structure, and thus, maintenance property may be improved and assembly error may be prevented.

Figure 7:
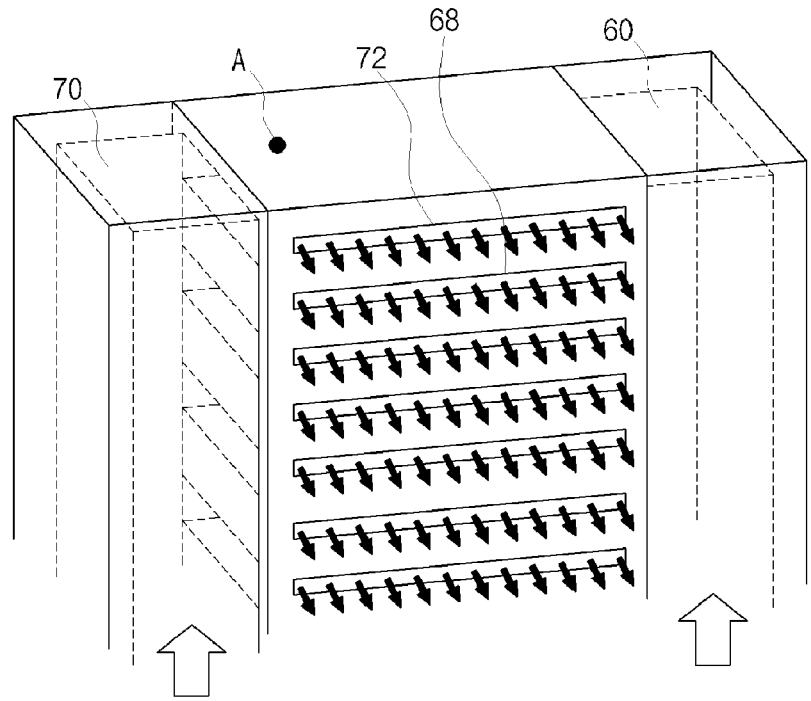
FIG. 7 exemplifies a shape of a gas supply nozzle in a configuration of a reaction chamber according to a second embodiment of the present invention.
Figure 7:
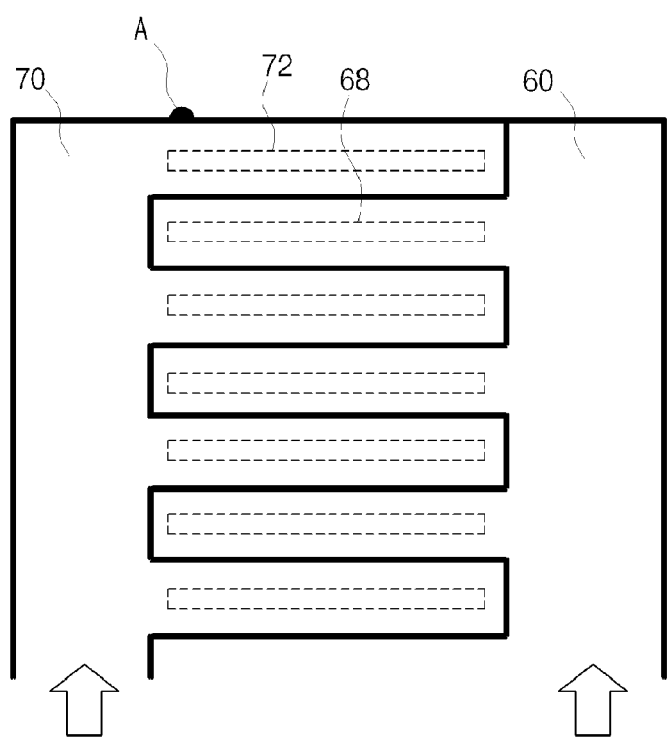

FIG. 7 shows a shape of the gas supply nozzle according to the second embodiment of the present invention. A nozzle shape shown in FIGS. 7A and 7B is an example of an integrated structure of the embodiment. In FIG. 7, a point A shown in FIG. 7A is the same point A as shown in 7B. As shown in FIG. 7, the nozzle shape of the second embodiment has a simple structure in comparison with the structure shown in FIG. 6. In addition, in comparison with the structure of FIG. 6, for example, manufacturing cost of the nozzle may be reduced. Further, for example, in periodical maintenance operations, etc., the nozzle may be easily assembled.

Figure 8:
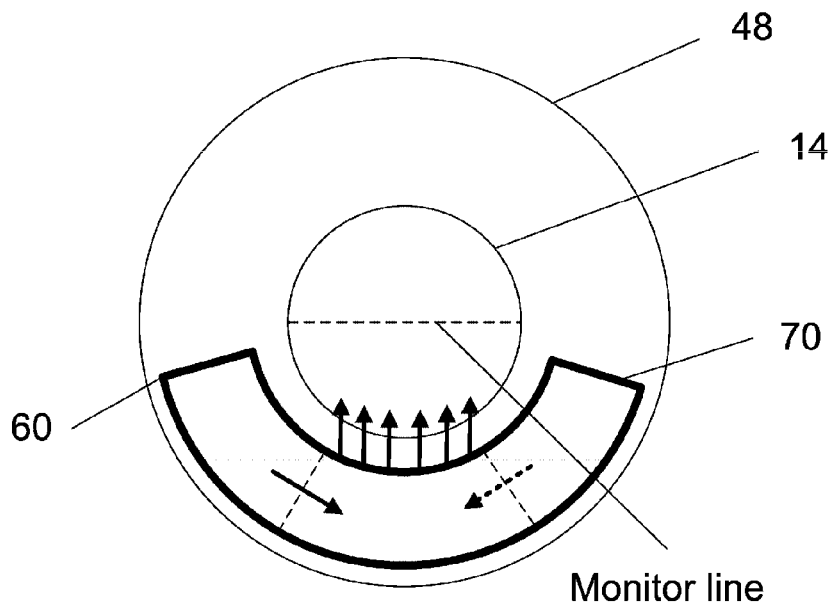
FIG. 8 shows a top view of the reaction chamber in the configuration of the reaction chamber according to the second embodiment of the present invention.

Further, a shape of the nozzle may be varied to correspond to the configuration of the reaction chamber 44. For example, as shown in FIG. 8, the nozzle may be curved along the inner wall of the object to be heated 48. Accordingly, since a gap between the nozzle and the object to be heated 48 may be reduced, intrusion of the gas may be suppressed and formation of the film in the gap may be suppressed. In addition, the nozzle is not limited thereto but may have a polygonal shape.

Therefore, in this embodiment, the source gas may be supplied parallel to the surfaces of the wafers 14. Accordingly, film quality of the SiC films formed on the wafers 14 is uniformized and concentration of the impurities is uniformized.

In addition, in this embodiment, since the gas supply nozzle is formed as an integrated structure, a maintenance operation, for example, a disassembly or installation operation upon exchange of the gas supply nozzle, may be easily performed. Further, since the gas supply nozzle is formed as an integrated structure, before and after exchange of the gas supply nozzle, generation of a difference in position of the first gas supply port 68 and the second gas supply port 72 may be suppressed. Accordingly, generation of a difference in a film-forming result before and after the maintenance operation may be reduced.

Third Embodiment

Hereinafter, the third embodiment will be described with reference to FIG. 12. The gas supply nozzles shown in FIG. 6 have a structure in which the one first gas supply nozzle 60 and the one second gas supply nozzle 70 are installed, the first branch pipe branched from the first gas supply nozzle 60 and the second branch pipe branched form the second gas supply nozzle 70 are alternately disposed in the space between the first supply gas nozzle 60 and the second gas supply nozzle 70. In comparison with the first embodiment, in this embodiment, a plurality of first gas supply nozzles 60 and a plurality of second gas supply nozzles 70 are installed, and branch pipes are installed therebetween. When the one first gas supply nozzle 60 and the one second gas supply nozzle 70 are installed as shown in FIG. 6, a large amount of gas must be supplied to each of the gas supply nozzles. Then, the gas is insufficiently heated, and temperature uniformity in a stack direction of the wafers 14 or in the surfaces of the wafers 14 may be disturbed. Meanwhile, in this embodiment, since the plurality of gas supply nozzles are installed, flow rates of the gases flowing through the nozzles may be distributed and the gas heating may be more advantageous.

In addition, in the shape of the gas supply nozzle shown in FIG. 6, due to pressure loss in the branch pipe, a difference in mass flow rate of the gases exiting through the gas supply port disposed at a base part of the branch pipe and the gas supply port disposed an a tip part of the branch pipe may occur. In order to solve this problem, a diameter of the branch pipe needs to increase to a certain extent. Meanwhile, in this embodiment, since the number of the gas supply ports installed at portions of the branch pipe is reduced, a flow path of the branch pipe may be minutely formed, and the gas supply ports may be densely installed in a vertical direction thereof.

Further, similar to the first embodiment, the first gas supply ports 68 and the second gas supply ports 72 may be installed at spaces between the wafers, respectively. As the gas supply ports are installed between the wafers 14, respectively, film-forming conditions of the wafers may be equalized, and uniformity between the wafers 14 may be improved. In particular, in this embodiment, since the gas supply ports may be densely disposed as described above, even when the first gas supply ports 68 and the second gas supply ports 72 are disposed between the wafers 14, respectively, a distance between the wafers 14 may be reduced. Thus, the number of the wafers 14 that may be processed at a time may be increased.

Figure 12:
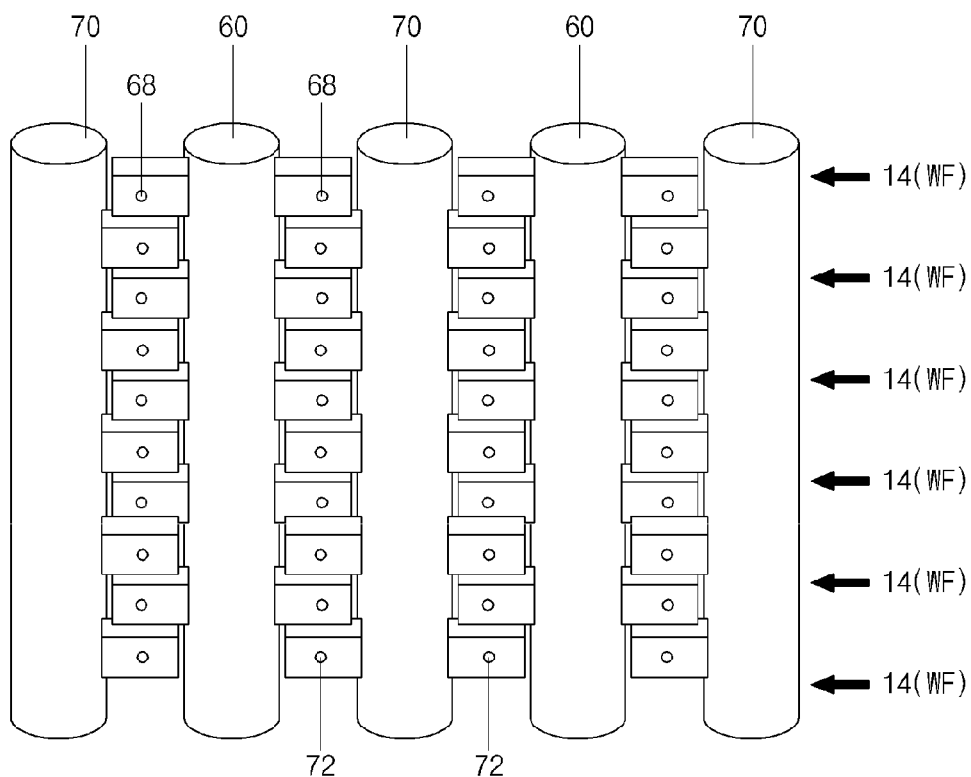
FIG. 12 exemplifies a shape of a gas supply nozzle according to a third embodiment of the present invention.

Furthermore, while the branch pipes in FIG. 12 have a prismatic shape; the branch pipes obviously may also have a cylindrical shape. In addition, although each of the branch pipes has one gas supply port, they may also have a plurality of gas supply ports.

Further, in this embodiment, the first gas supply ports 68 and the second gas supply ports 72 are disposed on straight lines. In consideration of mixing of the Si atom-containing gas and C atom-containing gas, while the gas supply ports may be disposed on straight lines, the gas supply ports may also deviate within an allowable range.

Fourth Embodiment

Figure 13A:
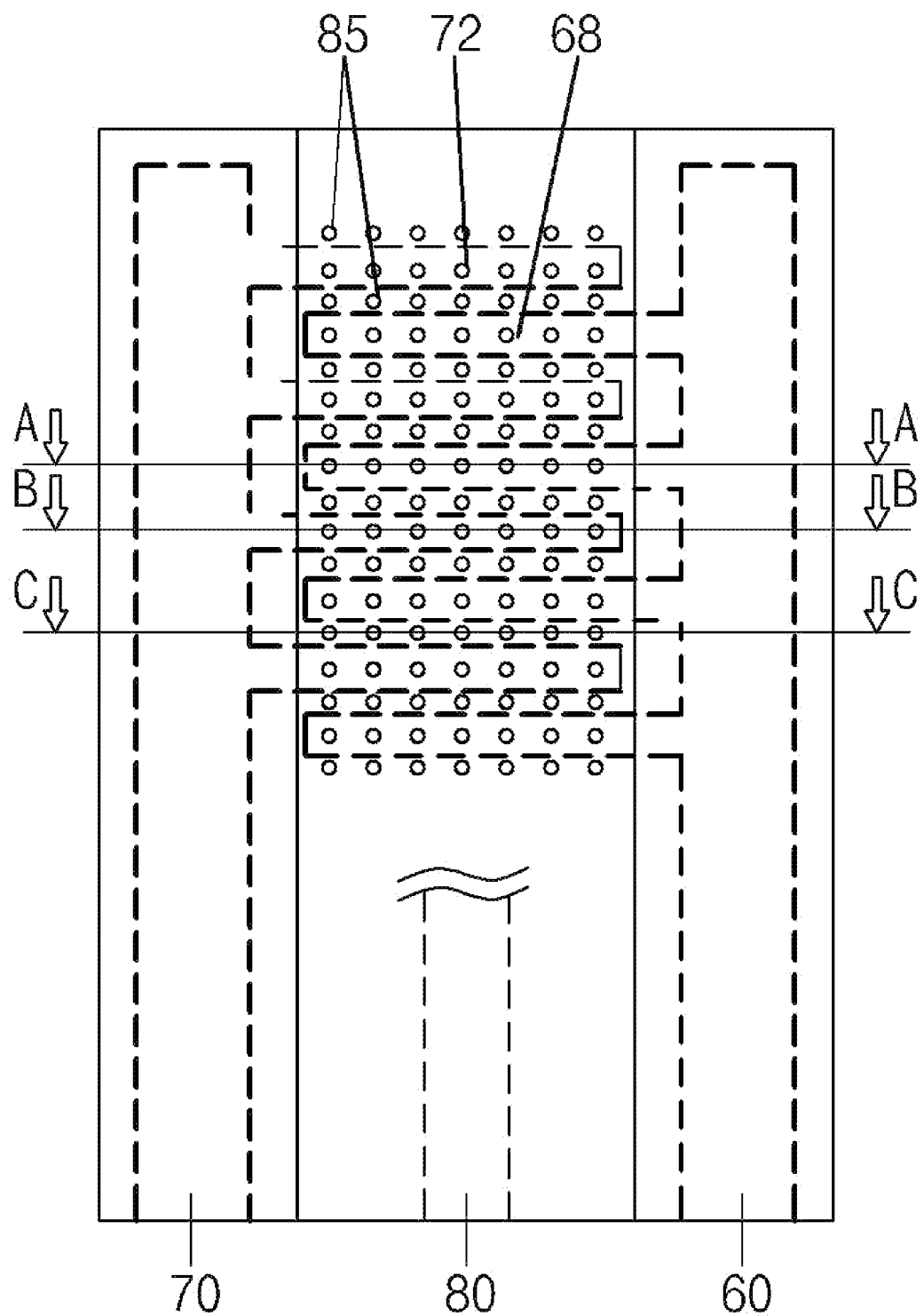
FIG. 13 exemplifies a shape of a gas supply nozzle according to a fourth embodiment of the present invention.
Figure 13B:
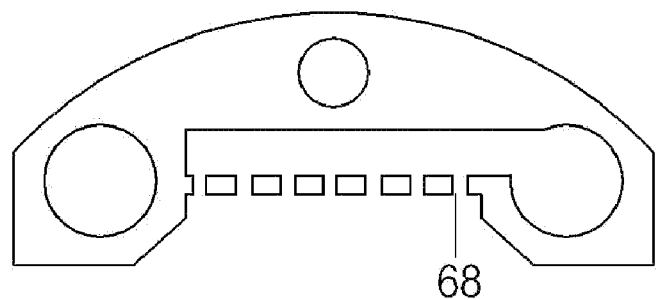
Figure 13B:
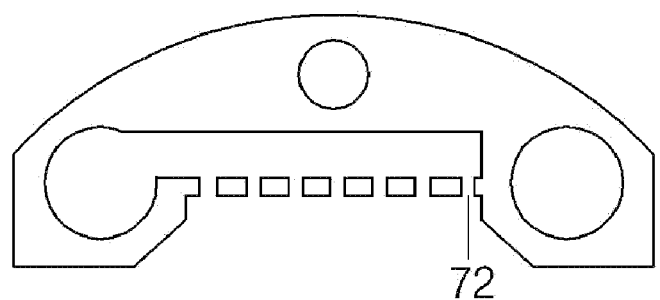
Figure 13B:
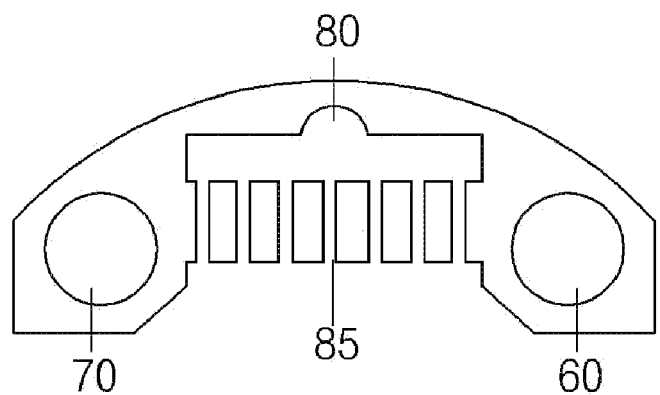

Hereinafter, the fourth embodiment will be described with reference to FIG. 13. FIG. 13A shows a side view of the gas supply nozzle of the fourth embodiment, and FIG. 13B shows cross-sectional views of positions shown in FIG. 13A. The gas supply nozzle of the fourth embodiment has a configuration in which a fourth gas supply port 85 is installed between the first gas supply port 68 configured to supply a Si atom-containing gas and the second gas supply port 72 configured to supply a C atom-containing gas. An inert gas, for example, Ar gas, is supplied through the fourth gas supply port 85.

As described above, in the batch-type vertical heat treatment apparatus, the gas supply nozzle needs to be installed in the reaction chamber. When gases, which are needed to form a film, are previously mixed and then supplied through one gas supply nozzle, since the SiC film is accumulated in the gas supply nozzle, the film cannot be easily formed between the wafers under a uniform condition. In contrast, in the present invention, two systems of the gas supply nozzles are installed such that gases are supplied into the reaction furnace with different gas mixing ratios than the film-forming condition, suppressing gas consumption due to accumulation in the gas supply nozzle. Here, since the inside of the gas supply nozzle is isolated from the reaction furnace, the above problem may be solved by installing the two systems. However, since the gas supply port is exposed to the inside of the reaction furnace and the gases supplied from the two gas supply nozzles are mixed, the condition of the inside of the reaction furnace becomes substantially the same as the film-forming condition. Accordingly, the gas supply port may be blocked by the accumulation. For this reason, in this embodiment, the fourth gas supply port 85 is installed between the first gas supply port 68 and the second gas supply port 72 to supply the inert gas, for example, Ar gas. Therefore, the gas supplied from the first gas supply port 68 and the gas supplied from the second gas supply port 72 are separated from each other by a flow of the inert gas near the gas supply ports 68 and 72 to suppress the accumulation into the gas supply ports.

As shown in FIG. 13, the gas supply nozzles, i.e., the first gas supply nozzle 68, the second gas supply nozzle 72 and the fourth gas supply nozzle 80, are integrally formed with each other, similar to the gas supply nozzles shown in FIG. 7. In addition, surfaces of the gas supply nozzles opposite to the surfaces at which the gas supply ports are installed have an arc shape to correspond to the shape of the reaction chamber 44. The fourth gas supply nozzle 80 is disposed between the first gas supply nozzle 60 and the second gas supply nozzle 70 in left and right directions of the drawing. The fourth gas supply nozzle 80 is installed at the arc-shaped part to avoid the part at which the first branch pipe and the second branch pipe are formed. That is, the fourth gas supply nozzle 80 is installed at an opposite side of the gas supply surface at which the gas supply ports are installed. Accordingly, the gas supply nozzle having a small size in comparison with the gas supply nozzle shown in FIG. 7 may be implemented.

The fourth gas supply port 85 is installed between the first gas supply port 68 and the second gas supply port 72. Accordingly, the gas supplied from the first gas supply port 68 and the gas supplied from the second gas supply port 72 may be separated from each other, and blocking of the gas supply ports due to deposition of the film may be suppressed.

In addition, while the plurality of gas supply ports as shown in FIG. 13 are installed, the gas supply ports may have a slit shape. Further, while the integrated gas supply nozzles shown in FIG. 13 are described, even when the separated gas supply nozzles shown in FIG. 6 or 12 are provided, the fourth gas supply port 85 may also be supplied between the first gas supply port 68 and the second gas supply port 72 to accomplish the same effect.

Further, while growth of the SiC epitaxial film of the present invention has been described, the present invention may be applied to the other epitaxial films, CVD films, etc.

Description of Effects of First to Fourth Embodiments

Figure 9:
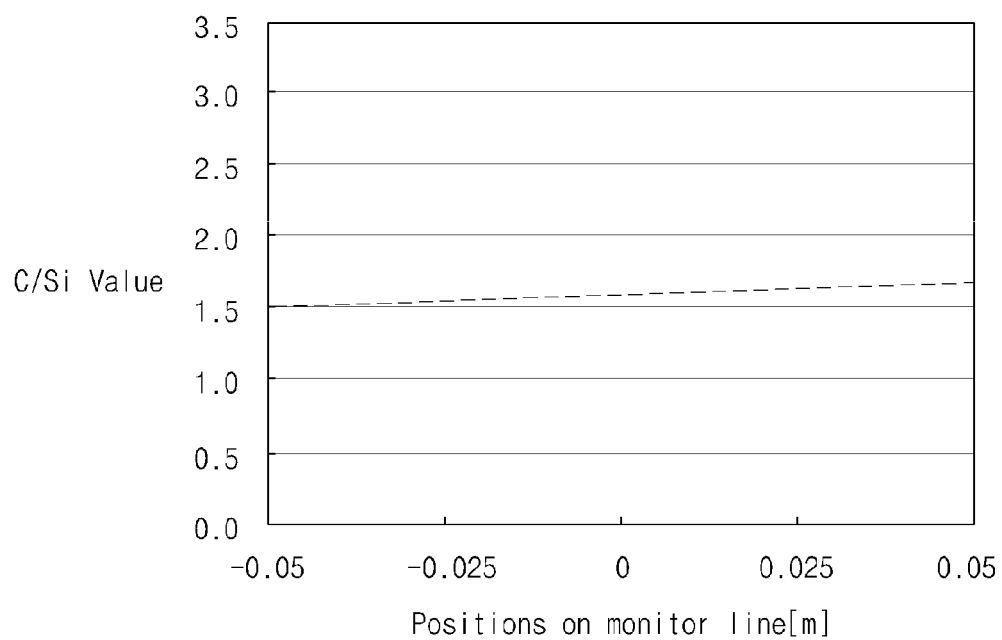
FIG. 9 shows distribution of C/Si values on a monitor line when a film is formed in the configuration of the reaction chamber according to the second embodiment of the present invention.

FIG. 9 shows distribution of the C/Si values on the monitor line shown in FIG. 8 of the SiC film, to which the impurities are doped, formed in the reaction chamber of the second embodiment. In FIG. 9, a horizontal axis represents a monitor line shown in dotted lines, and a vertical axis represents distribution of C/Si values of Si and C at respective positions on the monitor line. It will be appreciated that the distribution of the C/Si values of the formed SiC film is uniform. In addition, since the SiC film having a uniform C/Si value is formed, the n-type impurities or p-type impurities are uniformly doped, and thus, the SiC film to which the impurities are uniformly doped may be formed.

Figure 14A:
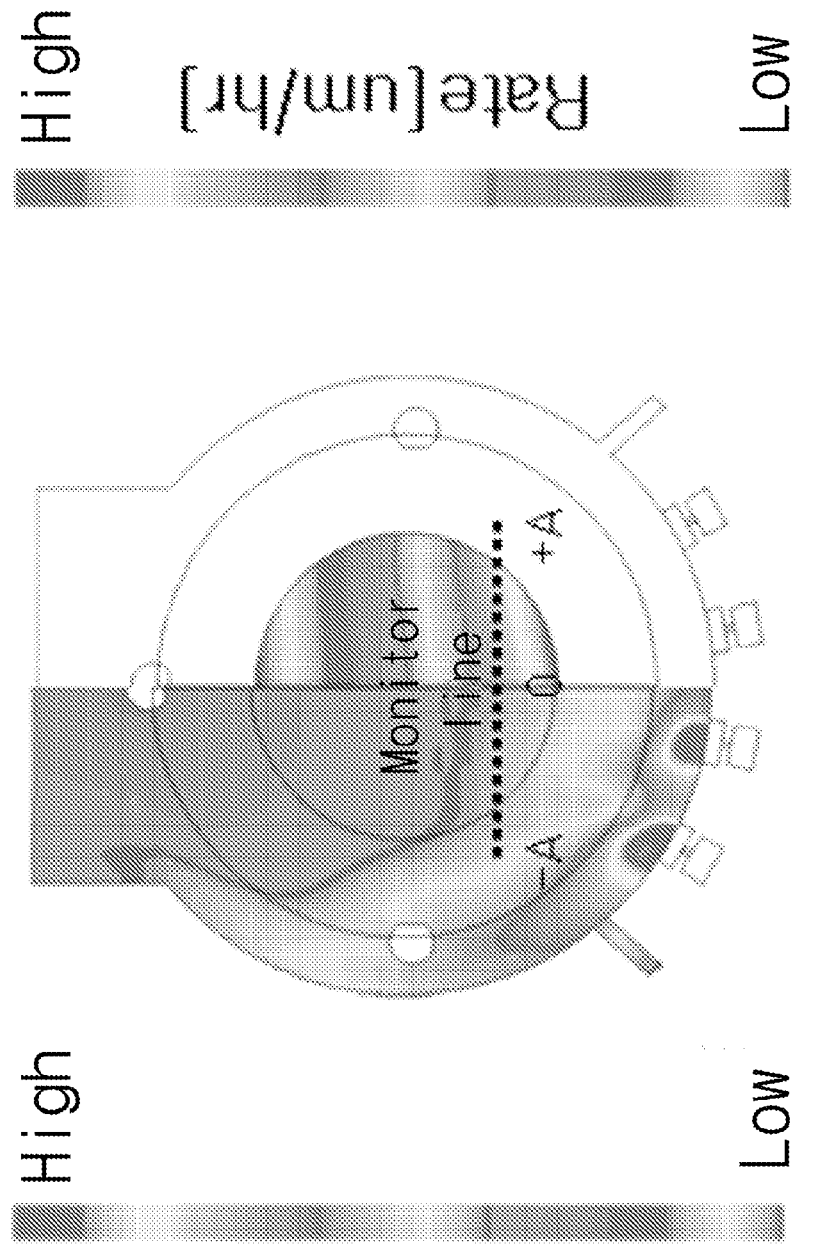
FIG. 14 is a diagram showing a thermal fluid analysis result in consideration of gas consumption in a configuration of the gas supply nozzle according to the third embodiment of the present invention.
Figure 14B:
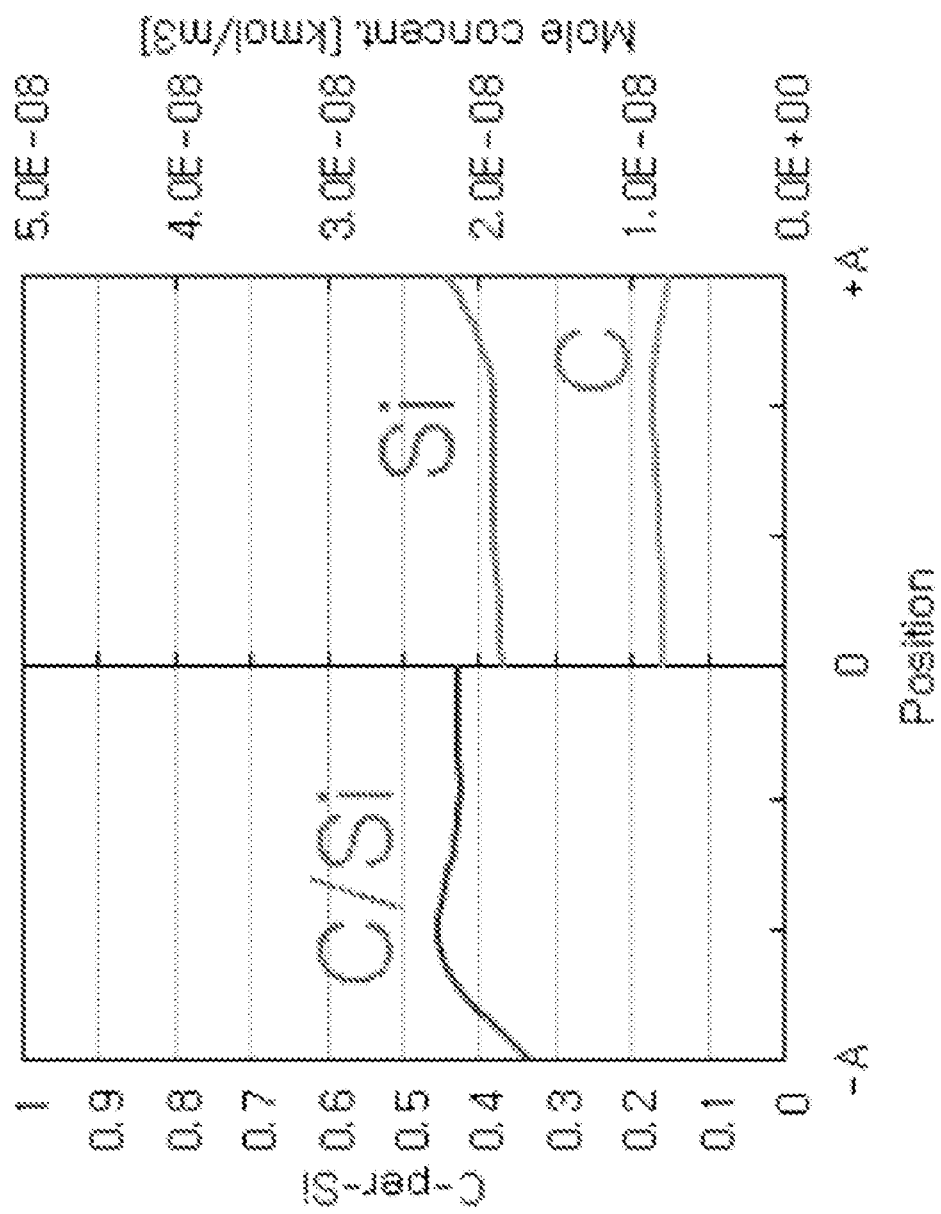
Figure 15A:
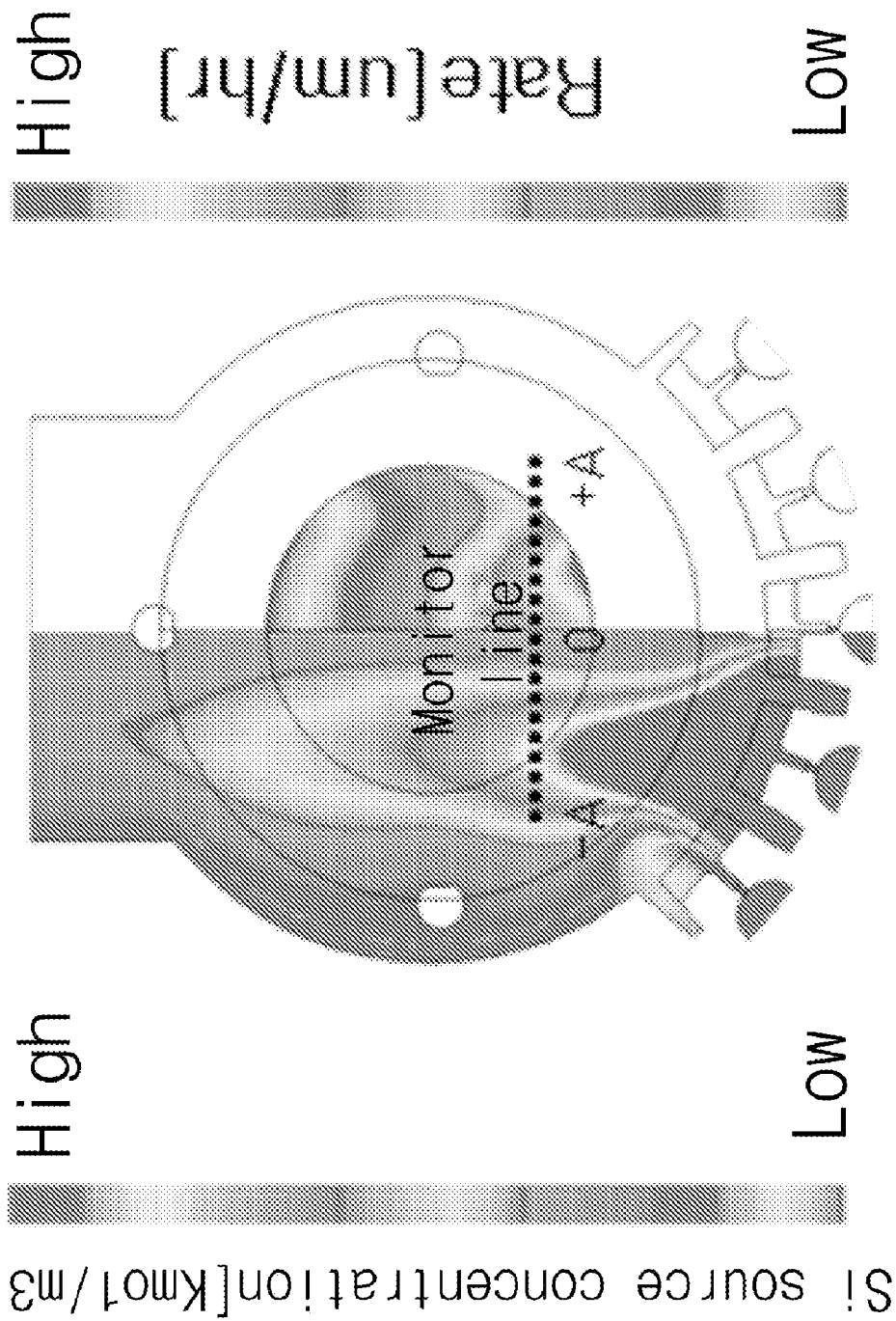
FIG. 15 is a diagram showing a thermal fluid analysis result in consideration of gas consumption in a configuration of a gas supply nozzle shown in FIG. 15A as a comparative example of the present invention.
Figure 15B:
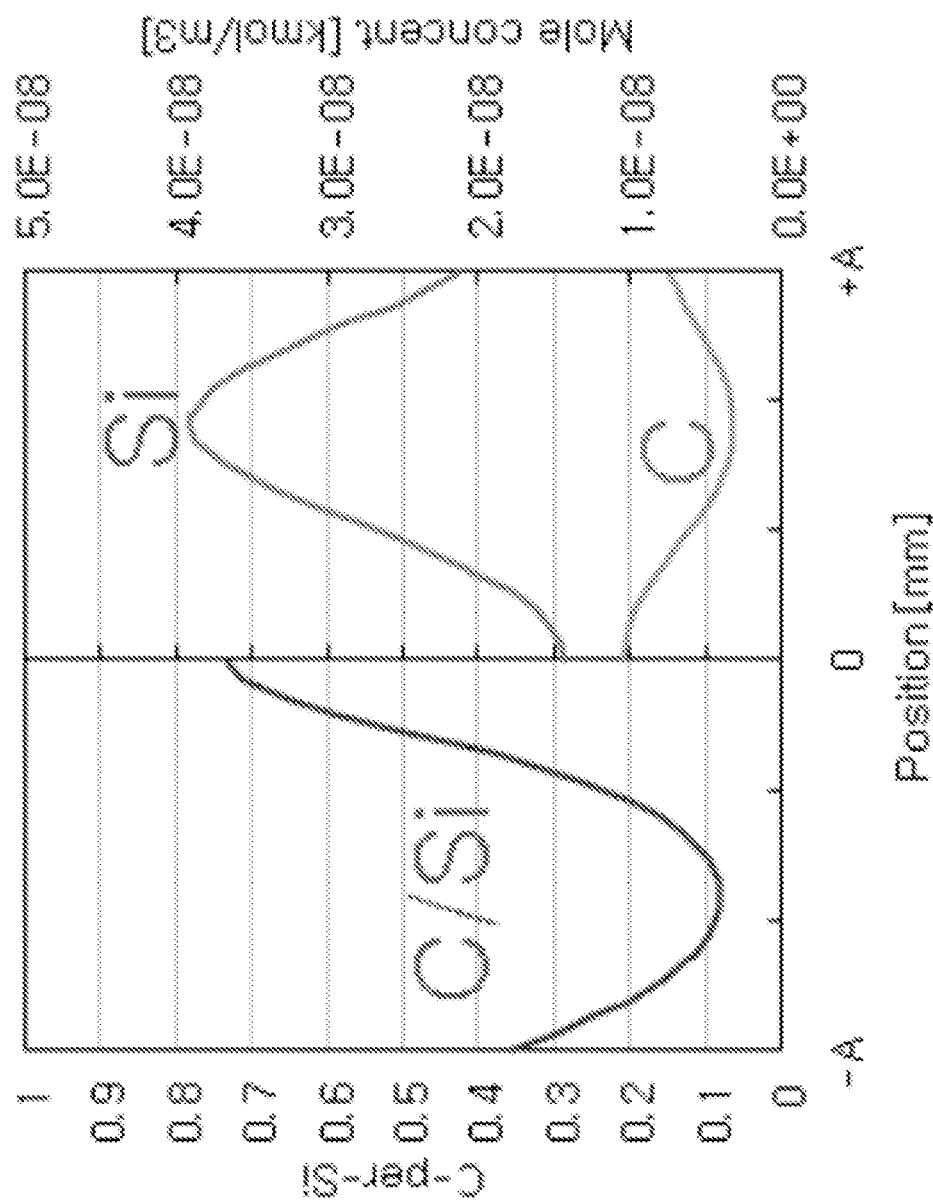

In addition, effects of the present invention will be described with reference to FIGS. 14 and 15. FIG. 14 shows calculation results of the distribution of Si, C and C/Si in the surfaces of the wafers, when the gas supply nozzle of FIG. 12 is used. FIG. 15 shows calculation results of the distribution of Si, C and C/Si in the surfaces of the wafers when gas supply nozzles 65 configured to supply the silicon-containing gas in a horizontal direction and gas supply nozzles 75 configured to supply the carbon-containing gas are arranged as shown in FIG. 15C as a comparative example. In addition, in each of FIGS. 14A and 15A, a left side shows concentration distribution of the Si source between the wafers, and a right side shows distribution of a film thickness at this time. Further, each of FIGS. 14B and 15B shows a plot diagram of concentration distribution of the Si source, concentration distribution of the C source and C/Si values on the monitor line shown in each of FIGS. 14A and 15A. Furthermore, the monitor line has the same height as the wafer surface.

In the gas supply nozzle structure shown in FIG. 15, the gases supplied through the respective gas supply ports are introduced toward center parts of the wafers. As a result, it will be appreciated that a large deviation of the concentration distribution in the Si source and the C source and distribution of the C/Si values on the monitor line exists. The Si and C source gases injected from the source supply nozzles are mixed with each other to be introduced into a wafer region. However, since the mixing is insufficient, the deviation on the monitor line may occur. As described above, when deviation in C/Si distribution occurs, deviation in film thickness in the wafer surface also occurs. In addition, according to the above-described site competition theory, donor concentration distribution in the wafer surface may deviate.

In addition, in order to improve a growth rate of the epitaxial film, a source concentration may be considered to be increased. When the source concentration is increased, since concentration of the Si source in a gas phase in contact with the wafer surface is increased, Si atoms are agglomerated to form a Si droplet remaining on the surface of the SiC film, and thus, a good quality of film may not be obtained. Accordingly, since the concentration of the source cannot be increased when the Si droplet remains on the wafer surface, the growth rate cannot be increased.

Meanwhile, since the plurality of gas supply ports are installed in a direction parallel to the wafers using the branch pipe according to the present invention, the Si source gas and the C source gas are injected from the nozzles, mixed with each other, and flow between the wafers. As a result, as clearly shown in FIG. 14, it will be appreciated that concentration distribution of the Si source and C source on the monitor line is uniform, and thus, distribution of the C/Si values is also uniform. At this time, reviewing the Si source concentration on the monitor line, a local point of high concentration is not observed. That is, in the same source concentration, a margin is generated until the Si droplet is formed on the wafer surface, and about twice the growth rate of the condition of FIG. 15 can be anticipated. Further, even in the donor concentration deviation due to site competition theory, the C/Si in the wafer surface of the present invention is advantageously uniformized.

According to the first to fourth embodiments, at least one of the following major effects can be accomplished.

(1) As the Si atom-containing gas and the C atom-containing gas are supplied through the first branch nozzle and the second branch nozzle extending in a direction parallel to the wafers 14 to form the SiC film, deviation of a ratio of Si and C in the surface of the SiC film can be reduced. Accordingly, uniformity of film quality in the surface of the SiC film can be improved. In addition, since concentration of the source gas can be increased, a growth rate is improved.

(2) As deviation in distribution of the ratio of Si and C, constituting the formed SiC film, in the surface of the SiC film is reduced and the impurity gas is supplied together with the reaction gas containing atoms substituted with impurities, uniformity of the film thickness and the impurity concentration of the SiC film, to which impurities are doped, formed on the wafer can be improved.

(3) When the SiC film to which the p-type impurities are doped is formed, at least the silicon-containing gas, the chlorine-containing gas and the p-type impurity gas are supplied into the reaction chamber 44 through the first gas supply nozzle, at least the carbon-containing gas and the reduction gas are supplied into the reaction chamber 44 through the second gas supply nozzle, and thus, uniformity in concentration of the p-type impurity in the surface of the SiC film, to which the p-type impurities are doped, formed on the wafer can be improved.

(4) When the SiC film to which the n-type impurities are doped is formed, at least the silicon-containing gas and the chlorine-containing gas are supplied into the reaction chamber 44 through the first gas supply nozzle, at least the carbon-containing gas, the reduction gas and the n-type impurity gas are supplied into the reaction chamber 44 through the second gas supply nozzle, and thus, uniformity in concentration of the n-type impurity in the surface of the SiC film, to which the n-type impurities are doped, formed on the wafer can be improved.

(5) According to (1) through (4), since the Si atom-containing gas and C atom-containing gas can be supplied into the reaction chamber 44 through different gas supply nozzles, respectively, formation of the SiC film in the gas supply nozzles can be suppressed.

(6) According to (5), blocking in the nozzle due to the accumulated SiC film can be suppressed.

(7) According to (5), generation of particles due to the accumulated SiC film can be suppressed.

(8) According to (1) through (4), since the Si atom-containing gas and reduction gas can be supplied into the reaction chamber 44 through different gas supply nozzles, respectively, decomposition of the silicon-containing gas in the gas supply nozzles can be suppressed.

(9) According to (8), consumption of the silicon-containing gas in the gas supply nozzle can be suppressed.

(10) According to (8), accumulation of the Si film in the gas supply nozzle of the silicon-containing gas can be suppressed.

(11) According to (8), generation of particles due to the accumulated Si film can be suppressed.

(12) According to the above effects, growth of the SiC epitaxial film, to which impurities are doped, can be performed on the substrates through only one process.

(13) As described in the second embodiment, since the first gas supply nozzle and the second gas supply nozzle are integrally formed with each other, the positions of the first gas supply port and the second gas supply port can be easily adjusted.

(14) According to (13), a difference in a film-forming result before and after the maintenance operation can be reduced.

(15) According to (13), since the installation operation becomes easy, a maintenance time can be reduced.

(16) In addition, according to the third embodiment, at least the plurality of first gas supply nozzle 60 or second gas supply nozzles 70 are installed and the branch nozzles are installed therebetween, and thus, a flow rate of the gas supplied through one branch nozzle can be reduced. Accordingly, the branch nozzles can be finely manufactured, and thus, the branch nozzles can be densely disposed.

(17) Further, according to the fourth embodiment, the inert gas is supplied between the first branch nozzle and the second branch nozzle, and thus, blocking of the first gas supply port 68 and the second gas supply port 72 due to accumulation of the SiC film can be suppressed.

Fifth Embodiment

Figure 18C:
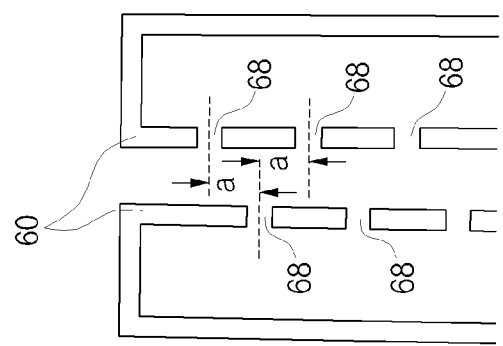
FIG. 18 shows a semiconductor manufacturing apparatus 10 according to a fifth embodiment of the present invention, FIG. 18A showing a horizontal cross-sectional view when seen from an upper surface thereof, FIG. 18B showing a shape of a supply nozzle, and FIG. 18C showing a cross-sectional view taken along line A-A' of FIG. 18B.
Figure 18B:
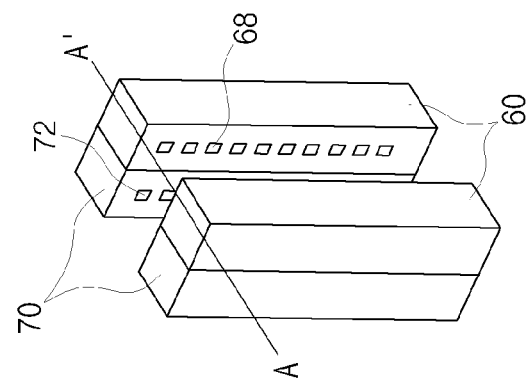
Figure 18A:
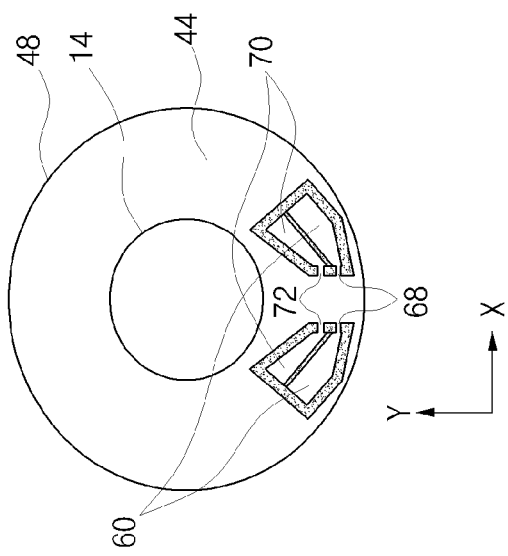

FIG. 18 shows an example of the fifth embodiment. FIG. 18A is a horizontal cross-sectional view of the semiconductor manufacturing apparatus 10 according to the fifth embodiment, when seen from an upper surface thereof FIG. 18B is a perspective view of an example of a shape of the gas supply nozzle according to the fifth embodiment. FIG. 18C is a cross-sectional view taken along line A-A' of FIG. 18B. As shown in FIGS. 18A and 18B, a pair of (two) first gas supply nozzles 60 are installed, and gas supply ports 68 are installed to correspond to the pair of nozzles. In addition, a pair of gas supply nozzles 70 are also installed, and gas supply ports 72 are installed to correspond to the pair of nozzles. The second gas supply nozzles 70 are disposed in a space between the first gas supply nozzles 60 and the wafers 14. In the reaction space between the outer circumference of the wafer 14 and the object to be heated 48, the pair of first gas supply nozzles 60 may be installed to oppose the gas supply ports 68 of the pair of nozzles along the object to be heated 48 as a sidewall of the reaction space. In addition, in a space between the outer circumference of the wafer 14 and the first gas supply nozzles 60, the pair of second gas supply nozzles 70 may be installed to oppose the gas supply ports 72 of the pair of nozzles (hereinafter, also referred to as dual opposite nozzles).

According to the above configuration, the reaction gases are mixed in a space nearer to the wafers 14 and supplied to all the wafers 14. Accordingly, the SiC films may be uniformly formed on the wafers 14. In addition, a supply amount of the reduction gas, for example, $H_2$ gas, supplied from the second gas supply port 72 may be larger than that of the silicon-containing gas, chlorine-containing gas and carbon-containing gas. As a result, the reaction gases may be more easily mixed. In addition, since the reaction gases may more uniformly flow through the wafers 14, the SiC films may be uniformly formed on the wafers 14.

In addition, at least one first gas supply port 68 is installed at the first gas supply nozzle 60. The first gas supply port 68 discharges the gas in a direction of the second gas supply nozzle 70 opposite to the first gas supply nozzle 60, i.e., a first direction (x-axis direction shown in FIG. 18A) parallel to the substrate surface. At least one second gas supply port 72 is installed at the second gas supply nozzle 70 to discharge the gas in a second direction opposite to the first direction. Specifically, the semiconductor manufacturing apparatus 10 includes the at least one pair of first gas supply nozzles 60 and the at least one pair of second gas supply nozzles 70. The at least one pair of first gas supply nozzles 60 are arranged in a direction perpendicular to a radial direction (y-axis direction of FIG. 18A) of the substrate and parallel to the substrate surface (x-axis direction), and installed to oppose each other. The at least one pair of second gas supply nozzles 70 are disposed between the first gas supply nozzles 60 and an outer circumference of the substrate, arranged in a direction perpendicular to the radial direction (y-axis direction) of the substrate and parallel to the substrate surface (x-axis direction), and installed to oppose each other. At least one first gas supply port 68 configured to discharge a gas in a direction of the gas supply nozzle 60 opposite to the one nozzle, i.e., the first direction (x-axis direction) parallel to the substrate surface, is installed at one nozzle of the at least one pair of first gas supply nozzles 60. At least one first gas supply port 68 configured to discharge a gas in the second direction opposite to the first direction is installed at the other nozzle of the at least one pair of first gas supply nozzles 60. At least one second gas supply port 72 configured to discharge a gas in the first direction is installed at one nozzle of the at least one pair of second gas supply nozzles 70. At least one second gas supply port 72 configured to discharge a gas in the second direction is installed at the other nozzle of the at least one pair of second gas supply nozzles 70.

In addition, as shown in FIG. 18C, the gas supply ports 68 of the two nozzles 60 are alternately installed in a vertical direction of the opposite gas supply ports 68 in a wafer placing region at a predetermined distance. Similarly, the gas supply ports 72 of the two nozzles 70 are alternately installed in a vertical direction of the opposite gas supply ports 72 in the wafer placing region at a predetermined distance. Accordingly, the gases supplied from the opposite gas supply ports 68 and 72 collide with wall surfaces of the nozzles to be mixed in a vortex, rather than colliding with each other at one point in a space between the two nozzles and mixing with each other. Since there is no need to mix the gases at one point in the space, even when positioning precision upon manufacture of the gas supply ports or upon assembly of the nozzles is low, a uniform gas flow between the surfaces of the wafers may be realized.

According to the above configuration, in a region around the gas supply ports 68 and a region around the object to be heated 48, only the silicon-containing gas, chlorine-containing gas and rare gas such as Ar gas as a carrier gas are present, but a reduction gas for reducing the carbon-containing gas and silicon-containing gas is not present. Accordingly, formation of the SiC film may be suppressed, and thus, probability of generation of particles may be suppressed. In addition, since the region is in a Si-rich state, a film formed by Si only, i.e., a Si film, may be formed. However, since the inside of the reaction chamber is heated to a melting point (about 1400° C.) of the Si or higher, formation of the Si film may be difficult.

In addition, in the example of FIG. 18, the pair of first gas supply nozzles 60 and the pair of second gas supply nozzles 70 are arranged in the x-axis direction of FIG. 18A, the first gas supply nozzles 60 are disposed outside the second gas supply nozzles 70, i.e., adjacent to the object to be heated 40, the first gas supply nozzles 60 are installed to oppose each other, and the second gas supply nozzles 70 are installed to oppose each other. However, the present invention is not limited thereto. That is, the pair of second gas supply nozzles 70 may be disposed outside the pair of first gas supply ports 60, i.e., adjacent to the object to be heated 48. Even in this case, the Si and C are effectively mixed with each other. Further, the one first gas supply nozzle 60 and the one second gas supply nozzle 70 may be arranged in the x-axis direction of FIG. 18A to oppose each other, and the other first gas supply nozzle 60 and the other second gas supply nozzle 70 may be arranged inside the one nozzles 60 and 70 such that the other gas supply nozzles are disposed in a reversed sequence with respect to the one gas supply nozzles. As a result, since arrangement sequences of the one gas supply nozzles disposed in a relatively inner side thereof and the other gas supply nozzles in a relatively outer side thereof are opposite to each other, the Si and C are effectively mixed with each other.

Figure 19:
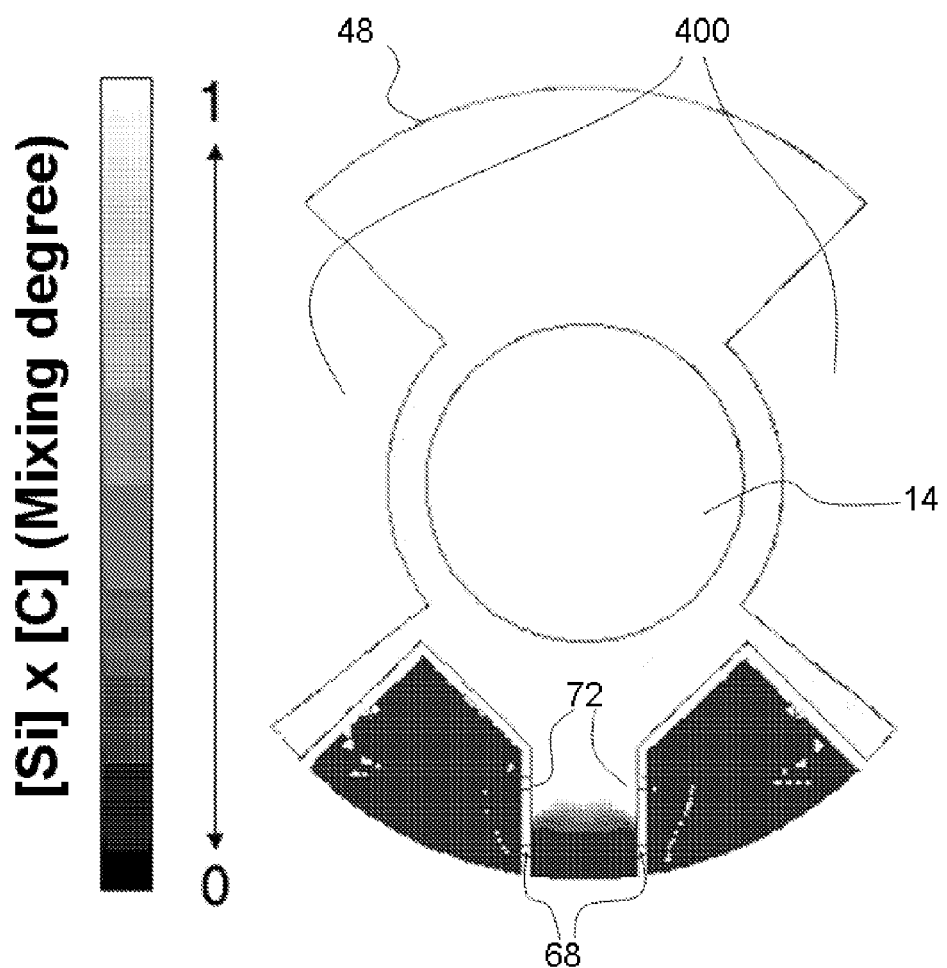
FIG. 19 shows a result calculated by a mixing degree of a silicon-containing gas and a carbon-containing gas, when a dual opposite nozzle according to the fifth embodiment of the present invention is used.

FIG. 19 shows a result in which a mixing degree of the silicon-containing gas and carbon-containing gas supplied when the dual opposite nozzles of the fifth embodiment are used is calculated.

FIG. 19 shows the result in which, in the dual opposite nozzles of the fifth embodiment, the silicon-containing gas and carbon-containing gas are supplied into the reaction chamber through the first gas supply ports 68 and the second gas supply ports 72, respectively, and the mixing degree of the silicon-containing gas and carbon-containing gas is flow-analyzed.

In FIG. 19, a value showing the mixing degree of the Si and C is represented as a product [Si]×[C] of the concentrations of the silicon-containing gas and carbon-containing gas. As [Si]×[C] approaches zero, i.e., as only the silicon-containing gas or carbon-containing gas remains, color is thickened. As [Si]×[C] approaches 1, i.e., as the silicon-containing gas and carbon-containing gas are substantially mixed with each other, color is thinned.

The SiC film may be formed while the silicon-containing gas and carbon-containing gas are consumed at a ratio of 1:1.

That is, as the silicon-containing gas and carbon-containing gas are substantially mixed at a ratio of 1:1, the SiC epitaxial film may be uniformly formed of the wafer 14, which is the substrate, and a film forming rate may be increased.

In FIG. 19, it will be appreciated that the silicon-containing gas supplied through the first gas supply ports 68 and the carbon-containing gas supplied through the second gas supply ports 72 are supplied into a reaction region and mixed with each other until the gases reach the wafer 14, which is the substrate. Accordingly, the effectively mixed reaction contributing gas may be supplied to the wafer 14, and the SiC epitaxial film may be uniformly formed on the wafer 14.

In addition, it will be appreciated that the mixing degree of the silicon-containing gas and carbon-containing gas is small just after injection thereof, and the gases are mixed as the gases reach the wafer 14, which is the substrate. Accordingly, formation of the SiC film near the first gas supply ports 68 or the second gas supply ports 72 is suppressed, and thus, generation of the particles due to accumulation of the SiC film and peeling of the accumulated SiC film may be suppressed.

FIG. 20A exemplifies a horizontal cross-sectional view of the semiconductor manufacturing apparatus 10 according to the fifth embodiment of the present invention, when seen from an upper surface thereof. In the case of the dual opposite nozzles shown in FIG. 20A, the gas supply ports 68 for the silicon-containing gas are opposite to each other, and the gas supply ports 72 for the carbon-containing gas are opposite to each other. Accordingly, the reaction contributing gas reaches the wafer surface, without deviation in concentration in a direction connecting the opposite gas supply ports, i.e., in the x-axis direction of the drawing, and thus, deviation in concentration of the silicon-containing gas and carbon-containing gas on the wafer 14 may be reduced. According to the monitor line of the wafer 14 shown in broken lines of FIG. 20A, FIG. 20B shows a concentration ratio C/Si of the carbon-containing gas and silicon-containing gas and a growth rate of the formed SiC film at each position of the monitor line as a result of the flow analysis.

In FIG. 20B, a concentration ratio C/Si of the carbon-containing gas and silicon-containing gas at each position on the monitor line of FIG. 20A is represented as a circular mark ●, and a film-forming rate of the formed SiC film is represented as a triangular mark ▲. A left vertical axis represent a film-forming rate (relative unit), a right vertical axis represents a concentration ratio C/Si of C and Si, and a horizontal axis represents a position on the monitor line of FIG. 20A.

In FIG. 20B, the film-forming rate and C/Si values at each position on the monitor line have substantially uniform values, regardless of positions. From this, deviation in concentration of Si and C in the formed SiC epitaxial film may be prevented, and a predetermined film thickness may be formed on the wafer 14 with no deviation.

It has been already mentioned that, in disposition of the gas supply nozzles, Si and C may be mixed well even when the first gas supply nozzles 60 are disposed outside or inside the second gas supply nozzles 70. However, the first gas supply nozzles 60 may be more preferably disposed outside the second gas supply nozzles 70. This will be described using the concentration ratio C/Si of the carbon-containing gas and silicon-containing gas when the first gas supply nozzles 60 are disposed outside the second gas supply nozzles 70 (the fifth embodiment) and when the first gas supply nozzles 60 are disposed inside the second gas supply nozzles 70 (the modified example A of the fifth embodiment). In addition, even in the case of the modified example A, similar to the fifth embodiment, the first gas supply nozzles 60 are opposite to each other, the second gas supply nozzles 70 are opposite to each other, the gas supply ports 68 for the silicon-containing gas are opposite to each other, and the gas supply ports 72 for the carbon-containing gas are opposite to each other.

FIG. 20C shows a concentration ratio C/Si of the carbon-containing gas and silicon-containing gas of the first embodiment and the modified example A at each position on the monitor line of the wafer 14 shown in broken lines of FIG. 20A. FIG. 20C shows a result of the flow analysis. In FIG. 20C, the concentration ratio C/Si of the fifth embodiment is represented as a circular mark ● and the concentration ratio C/Si of the modified example is represented as a triangular mark ▲. A vertical axis represents the concentration ratio C/Si (relative unit) of C and Si, and a horizontal axis represents positions on the monitor line of FIG. 20A. In FIG. 20C, the concentration ratio C/Si of the fifth embodiment is substantially uniform at each position on the monitor line, and the concentration ratio C/Si of the modified example A is slightly lowered at both ends on the monitor line. Accordingly, the fifth embodiment has a more uniform concentration ratio C/Si than that of the modified example A.

The reason that the fifth embodiment has a more uniform concentration ratio C/Si than that of the modified example A is considered to be as follows. As described above, a supply amount of the reduction gas, for example, $H_2$ gas, supplied through the second gas supply ports 72 together with the carbon-containing gas may be substantially larger than that of the silicon-containing gas or chlorine-containing gas. For this reason, similar to the modified example A, when the first gas supply nozzles 60 (for the silicon-containing gas) are disposed inside the second gas supply nozzles 70 (for the $H_2$ gas), the silicon-containing gas and carbon-containing gas are pushed by the $H_2$ gas having a large flow rate to be delivered onto the wafer without being substantially mixed like the fifth embodiment. On the other hand, similar to the fifth embodiment, when the first gas supply nozzles 60 (for the silicon-containing gas) are disposed outside the second gas supply nozzles 70 (for the $H_2$ gas), the silicon-containing gas slowly moves toward the second gas supply nozzles 70 in a vortex state, and the silicon-containing gas and carbon-containing gas are substantially mixed to be delivered onto the wafer by the flow of the $H_2$ gas. Accordingly, the fifth embodiment shows better uniformity of the concentration ratio C/Si than that of the modified example A.

According to the fifth embodiment, at least one of the following effects can be provided.

As the dual opposite nozzles of the fifth embodiment are installed, (1) At least the silicon-containing gas and the chlorine-containing gas are supplied through the first gas supply ports 68, and at least the carbon-containing gas and reduction gas are supplied through the second gas supply ports 72, so that formation of the accumulated film in the gas supply nozzles can be suppressed.

(2) According to (1), consumption of the source gas in the gas supply nozzles can be suppressed, and growth of the SiC epitaxial film at upstream and downstream sides of the first and second gas supply nozzles in the reaction chamber 44 can be uniformly performed.

(3) According to (1), blocking in the nozzles due to growth of the film accumulated in the nozzles can be suppressed.

(4) In addition, a problem of increasing particles in the reaction chamber 44 due to delamination or separation of the accumulations in the nozzles, or sticking of the particles to the wafer 14 can be suppressed.

(5) Formation of the SiC film on the wall surface in the processing region can be suppressed, and thus, generation of particles can be suppressed.

(6) Deviation in concentrations of the carbon-containing gas and silicon-containing gas in the wafer surface can be reduced, and thus, uniformity of the film thickness of the SiC epitaxial film in the wafer surface can be improved.

(7) According to the above effects, growth of the SiC epitaxial films on the plurality of substrates can be performed through one process.

Sixth Embodiment

Hereinafter, the sixth embodiment will be described.

The sixth embodiment is a modified example of the fifth embodiment. In the sixth embodiment, the first gas supply nozzles 60 and the second gas supply nozzles 70 are separately installed, and the first gas supply ports 68 and the second gas supply ports 72 are disposed to oppose each other, so that the silicon-containing gas and carbon-containing gas are effectively mixed and then supplied to the wafer 14, which is the substrate, to form the SiC epitaxial film.

FIG. 21 shows an example of the sixth embodiment. As shown in FIG. 21, for example, the first gas supply nozzles 60 having a cylindrical shape are installed in parallel (two shown in FIG. 21), and at least one first gas supply port 68 installed at one of the first gas supply nozzles 60 and at least one first gas supply port 68 installed at the other of the first gas supply nozzles 60 are installed to oppose each other. In addition, for example, the second gas supply nozzles 70 having a cylindrical shape are installed in parallel (two shown in FIG. 21), and at least one second gas supply port 72 installed at one of the second gas supply nozzles 70 and at least one second gas supply port 72 installed at the other of the second gas supply nozzles 70 are installed to oppose each other. Accordingly, the silicon-containing gas and carbon-containing gas may be substantially mixed with each other before reaching the substrate, and the SiC epitaxial film may be uniformly formed on the wafer 14, which is the substrate. In addition, in comparison with the shape of the gas supply nozzle of the fifth embodiment, the gas supply nozzle may be easily manufactured.

At this time, as shown in FIG. 21, the second gas supply nozzles 70 may be installed between the wafer 14 and the first gas supply nozzles 60. Accordingly, the silicon-containing gas and chlorine-containing gas may be effectively mixed. In addition, formation of the film around the first gas supply port in the reaction chamber may be suppressed.

Further, preferably, the first gas supply nozzles 60 and the second gas supply nozzles 70 may be configured such that there is no gap between the first gas supply nozzles 60 and the inner wall of the object to be heated 48 or between the first gas supply nozzles 60 and the second gas supply nozzles 70. For example, the first gas supply nozzles 60 and the second gas supply nozzles 70 may have a polygonal shape or an arc shape.

Therefore, since intrusion of the reaction contributing gas into the gap may be suppressed, the reaction contributing gas may be effectively supplied to the wafer 14, formation of the SiC film in the gap may be suppressed, and probability of generation of particles due to peeling-off of the SiC film may also be suppressed.

According to the sixth embodiment, in addition to the effects of the fifth embodiment, at least one of the following effects can be provided.

(1) The gas supply can be easily manufactured.

(2) According to (1), running cost upon exchange of the gas supply nozzle can be reduced.

Seventh Embodiment

Hereinafter, the seventh embodiment will be described. The seventh embodiment is a modified example of the fifth embodiment. In the seventh embodiment, the first gas supply nozzle 60 and the second gas supply nozzles 70 are separately installed, the first gas supply port 68 is installed in the direction of the wafer 14, and the second gas supply ports 72 are opposite to each other, so that the silicon-containing gas and carbon-containing gas are effectively mixed with each other and supplied to the wafer 14, which is the substrate, to form the SiC epitaxial film.

FIG. 22 shows an example of the seventh embodiment. As shown in FIG. 22, for example, the first gas supply nozzle 60 having a cylindrical shape is installed (one shown in FIG. 22), and at least one first gas supply port 68 is installed at the first gas supply nozzle 60 in the direction of the wafer 14. The second gas supply nozzles 70 having a cylindrical shape are installed in parallel (two shown in FIG. 22), and at least one second gas supply port 72 installed at one of the second gas supply nozzles 70 and at least one second gas supply port 72 installed at the other of the second gas supply nozzles 70 are installed to oppose each other.

Therefore, since the silicon-containing gas and carbon-containing gas may be substantially mixed with each other before reaching the substrate, the SiC epitaxial film may be uniformly formed on the wafer 14 as the substrate. In addition, since the first gas supply port 68 is installed in the direction of the wafer 14, a mixture of the silicon-containing gas and carbon-containing gas may be easily supplied in the direction of the wafer 14. Further, since the number of the gas supply nozzles may be reduced, the number of parts may be reduced and running cost may also be reduced.

At this time, as shown in FIG. 22, the second gas supply nozzles 70 may be installed between the wafer 14 and the first gas supply nozzle 60. Accordingly, the silicon-containing gas, chlorine-containing gas and carbon-containing gas may be effectively mixed with one another. In addition, formation of the film around the first gas supply port in the reaction chamber may be suppressed.

In addition, preferably, the first gas supply nozzle 60 and the second gas supply nozzles 70 may be configured to prevent generation of a gap between the first gas supply nozzle 60 and the inner wall of the object to be heated 48 or between the first gas supply nozzle 60 and the second gas supply nozzles 70. For example, the first gas supply nozzle 60 and the second gas supply nozzles 70 may have a polygonal shape. Accordingly, since intrusion of the reaction contributing gas into the gap may be suppressed, the reaction contributing gas may be effectively supplied to the wafer 14, formation of the SiC film in the gap may be suppressed, and probability of peeling of the SiC film and generating particles may also be suppressed.

According to the seventh embodiment, in addition to the effects of the fifth and sixth embodiments, at least one of the following effects can be provided.

(1) A mixture of the silicon-containing gas and carbon-containing gas can be effectively supplied to the wafer 14.

(2) In addition, the number of the gas supply nozzles can be reduced, and the number of parts constituting the semiconductor processing apparatus can be reduced.

In addition, the present invention is not limited to the above embodiments but may be variously modified without departing from the scope of the embodiments.

Supplementary Notes

Hereinafter, preferred aspects according to the embodiments will be additionally stated.

Supplementary Note 1

A substrate processing apparatus including: a reaction chamber having therein a plurality of substrates stacked to have a predetermined distance therebetween; a first gas supply system configured to supply one of a mixture of a silicon-containing gas and a chlorine-containing gas and a silicon/chlorine-containing gas into the reaction chamber; a second gas supply system configured to supply at least a carbon-containing gas and a reduction gas into the reaction chamber; a first gas supply nozzle installed and extending in a region where the plurality of substrates are stacked; a second gas supply nozzle extending in the region, the second gas supply nozzle being installed in a position different from that of the first gas supply nozzle; a first branch nozzle installed at the first gas supply nozzle in a direction parallel to a major surface of each of the plurality of substrates, the first branch nozzle being branched toward the second gas supply nozzle and including at least one first gas supply port; a second branch nozzle installed at the second gas supply nozzle in the direction parallel to the major surface of each of the plurality of substrates, second branch nozzle being branched toward the first gas supply nozzle, and including at least one second gas supply port; and a controller configured to control the first gas supply system and the second gas supply system to supply one of the mixture of the silicon-containing gas and the chlorine-containing gas and the silicon/chlorine-containing gas into the reaction chamber through the at least one first gas supply port and supply at least the carbon-containing gas and the reduction gas into the reaction chamber through the at least one second gas supply port such that a silicon carbide film is formed on each of the plurality of substrates, wherein the at least one first gas supply port and the at least one second gas supply port are installed adjacent to each other in a stacking direction of the plurality of substrates.

Supplementary Note 2

The substrate processing apparatus according to supplementary note 1, wherein the first branch nozzle and the second branch nozzle are alternately disposed.

Supplementary Note 3

The substrate processing apparatus according to supplementary note 2, wherein the first branch nozzle and the second branch nozzle are disposed to form a pair in a region between the plurality of substrates.

Supplementary Note 4

The substrate processing apparatus according to supplementary note 3, wherein the first branch nozzle is disposed closer to a film-forming surface of each of the plurality of substrates than the second branch nozzle.

Supplementary Note 5

The substrate processing apparatus according to supplementary note 4, wherein the carbon-containing gas supplied through the second branch nozzle is diffused toward a gas flow of the mixture of the silicon-containing gas and the chlorine-containing gas or the silicon/chlorine-containing gas supplied through the first branch nozzle with respect to the film-forming surface of each of the plurality of substrates.

Supplementary Note 6

The substrate processing apparatus according to supplementary note 1, further including a boat configured to hold the plurality of substrates, wherein each of the plurality of substrates is held by a wafer holder in the boat.

Supplementary Note 7

The substrate processing apparatus according to supplementary note 1, wherein each of the at least one first gas supply port and the at least one second gas supply port has a slit shape parallel to a surface of each the plurality of substrates.

Supplementary Note 8

The substrate processing apparatus according to supplementary note 1, wherein the first gas supply nozzle and the second gas supply nozzle are integrally formed.

Supplementary Note 9

The substrate processing apparatus according to supplementary note 1, wherein each of the first gas supply nozzle and the second gas supply nozzle has a polygonal shape.

Supplementary Note 10

The substrate processing apparatus according to supplementary note 1, wherein a portion of each of the first gas supply nozzle and the second gas supply nozzle has an arc shape.

Supplementary Note 11

The substrate processing apparatus according to supplementary note 1, further including a third gas supply system configured to supply at least an impurity gas into the reaction chamber, wherein the third gas supply system supplies the impurity gas through one of the first gas supply port and the second gas supply port.

Supplementary Note 12

The substrate processing apparatus according to supplementary note 1, comprising a plurality of the first gas supply nozzle and a plurality of the second gas supply nozzle, wherein the first gas supply nozzle and the second gas supply nozzle are alternately disposed.

Supplementary Note 13

The substrate processing apparatus further including a third gas supply nozzle configured to supply an inert gas between the first branch nozzle and the second branch nozzle.

Supplementary Note 14

A method of manufacturing a semiconductor device using a substrate processing apparatus including: a reaction chamber having therein a plurality of substrates stacked at a predetermined distance; a first gas supply nozzle installed and extending in a region where the plurality of substrates are stacked; a second gas supply nozzle extending in the region, the second gas supply nozzle being installed in a position different from that of the first gas supply nozzle; a first branch nozzle installed at the first gas supply nozzle in a direction parallel to a major surface of each of the plurality of substrates, the first branch nozzle being branched toward the second gas supply nozzle and including at least one first gas supply port; a second branch nozzle installed at the second gas supply nozzle in the direction parallel to the major surface of each of the plurality of substrates, second branch nozzle being branched toward the first gas supply nozzle, and including at least one second gas supply port, wherein the at least one first gas supply port and the at least one second gas supply port are installed adjacent to each other in a stacking direction of the plurality of substrates, the method including steps of:

loading the plurality of substrates into the reaction chamber; and supplying one of a mixture of the silicon-containing gas and the chlorine-containing gas and a silicon/chlorine-containing gas into the reaction chamber through the at least one first gas supply port and supplying at least a carbon-containing gas and a reduction gas into the reaction chamber through the at least one second gas supply port to form a silicon carbide film.

Supplementary Note 15

A method of manufacturing a substrate using a substrate processing apparatus including: a reaction chamber having therein a plurality of substrates stacked at a predetermined distance; a first gas supply nozzle installed and extending in a region where the plurality of substrates are stacked; a second gas supply nozzle extending in the region, the second gas supply nozzle being installed in a position different from that of the first gas supply nozzle; a first branch nozzle installed at the first gas supply nozzle in a direction parallel to a major surface of each of the plurality of substrates, the first branch nozzle being branched toward the second gas supply nozzle and including at least one first gas supply port; a second branch nozzle installed at the second gas supply nozzle in the direction parallel to the major surface of each of the plurality of substrates, second branch nozzle being branched toward the first gas supply nozzle, and including at least one second gas supply port, wherein the at least one first gas supply port and the at least one second gas supply port are installed adjacent to each other in a stacking direction of the plurality of substrates, the method including the steps of: loading the plurality of substrates into the reaction chamber; and forming SiC films by supplying at least the silicon-containing gas and the chlorine-containing gas, or the silicon/chlorine-containing gas through the first gas supply port and supplying at least the carbon-containing gas and the reduction gas through the second gas supply port.

Supplementary Note 16

A method of manufacturing a semiconductor device using a substrate processing apparatus including: a reaction chamber in which substrates are vertically stacked and arranged at a predetermined distance; at least one first gas supply nozzle installed to extend to an arrangement region of the substrates in the reaction chamber; at least one second gas supply nozzle installed to extend to a different position from a position at which the first gas supply nozzle is installed in the arrangement region of the substrates in the reaction chamber; at least one first gas supply port installed at the first gas supply nozzle; and at least one second gas supply port installed at the second gas supply nozzle, wherein the second gas supply nozzle is installed between the substrates and the first gas supply nozzle, the method including the steps of: loading the substrates vertically stacked and arranged at a predetermined distance into the reaction chamber; forming SiC films by supplying at least a silicon-containing gas and a chlorine-containing gas through the first gas supply port and supplying at least a carbon-containing gas and a reduction gas through the second gas supply port; and unloading the substrates from the reaction chamber.

According to the above configuration, in comparison with when a gas discharge direction of the first gas supply port and a gas discharge direction of the second gas supply port are not opposite to each other, the silicon-containing gas supplied through the first gas supply port and the carbon-containing gas supplied through the second gas supply port can be mixed with each other in the reaction chamber before reaching the substrates. Accordingly, a semiconductor device having a better distribution (a smaller deviation in SiC ratio) of a concentration ratio C/Si of the carbon-containing gas and the silicon-containing gas of a formed SiC epitaxial film in a wafer surface can be manufactured. In addition, formation of the film adjacent to the first gas supply port in the reaction chamber can be suppressed.

Further, the first gas supply nozzle and the second gas supply nozzle may be installed at a space between an object to be heated installed in the reaction chamber and the plurality of stacked substrates.

Supplementary Note 17

A substrate processing apparatus including: a reaction chamber having therein substrates vertically stacked and arranged to have at a predetermined distance therebetween; a first gas supply system configured to supply at least a silicon-containing gas and a chlorine-containing gas into the reaction chamber; a second gas supply system configured to supply at least a carbon-containing gas and a reduction gas into the reaction chamber; a first gas supply nozzle installed and extending in a region where the substrates are stacked and arranged; a second gas supply nozzle extending in the region, the second gas supply nozzle being installed in a position different from that of the first gas supply nozzle; at least one gas supply port installed at the first gas supply nozzle; at least one second gas supply port installed at the second gas supply nozzle; and a controller configured to control the first gas supply system and the second gas supply system to supply at least the silicon-containing gas and the chlorine-containing gas into the reaction chamber through the at least one first gas supply port and supply at least the carbon-containing gas and the reduction gas into the reaction chamber through the at least one second gas supply port such that a silicon carbide film is formed on each of the substrates, wherein the second gas supply nozzle is installed between the substrates and the first gas supply nozzle.

According to the above configuration, in comparison with when a gas discharge direction of the first gas supply port and a gas discharge direction of the second gas supply port are not opposite to each other, the silicon-containing gas supplied through the first gas supply port and the carbon-containing gas supplied through the second gas supply port can be mixed with each other in the reaction chamber before reaching the substrates. Accordingly, a semiconductor device having a better distribution (a smaller deviation in SiC ratio) of a concentration ratio C/Si of the carbon-containing gas and the silicon-containing gas of a formed SiC epitaxial film in a wafer surface can be manufactured. In addition, formation of the film adjacent to the first gas supply port in the reaction chamber can be suppressed.

Further, the first gas supply nozzle and the second gas supply nozzle may be arranged in a direction perpendicular to a radiation direction of the substrates and parallel to surfaces of the substrates, and in a space before the flowed gas reaches a wafer, a direction of the first gas supply port and a direction of the second gas supply port may cross each other.

Supplementary Note 18

A method of manufacturing a substrate in a substrate processing apparatus including: a reaction chamber having therein substrates vertically stacked and arranged to have at a predetermined distance therebetween; a first gas supply system configured to supply at least a silicon-containing gas and a chlorine-containing gas into the reaction chamber; a second gas supply system configured to supply at least a carbon-containing gas and a reduction gas into the reaction chamber; a first gas supply nozzle installed and extending in a region where the substrates are stacked and arranged; a second gas supply nozzle extending in the region, the second gas supply nozzle being installed in a position different from that of the first gas supply nozzle; at least one gas supply port installed at the first gas supply nozzle; and at least one second gas supply port installed at the second gas supply nozzle; wherein the second gas supply nozzle is installed between the substrates and the first gas supply nozzle, the method including the steps of: loading the substrates vertically stacked and arranged at a predetermined distance into the reaction chamber; forming SiC films by supplying at least a silicon-containing gas and a chlorine-containing gas through the first gas supply port and supplying at least a carbon-containing gas and a reduction gas through the second gas supply port; and unloading the substrates from the reaction chamber.

According to the above configuration, in comparison with when a gas discharge direction of the first gas supply port and a gas discharge direction of the second gas supply port are not opposite to each other, the silicon-containing gas supplied through the first gas supply port and the carbon-containing gas supplied through the second gas supply port can be mixed with each other in the reaction chamber before reaching the substrates. Accordingly, a semiconductor device having a better distribution (a smaller deviation in SiC ratio) of a concentration ratio C/Si of the carbon-containing gas and the silicon-containing gas of a formed SiC epitaxial film in a wafer surface can be manufactured. In addition, formation of the film adjacent to the first gas supply port in the reaction chamber can be suppressed.

Supplementary Note 19

The substrate processing apparatus according to supplementary note 17, wherein the first gas supply port and the second gas supply port are installed at different heights.

According to the above configuration, mixing efficiency of gas injected from the gas supply port can be improved.

Supplementary Note 20

The substrate processing apparatus according to supplementary note 17, wherein an installation direction of the first gas supply port and the second gas supply port is such that the gases discharged through the first gas supply port and the second gas supply port cross each other before the gases reaches the substrates. According to the above configuration, a gas contributing to reaction supplied through the first gas supply port and the second gas supply port can be substantially mixed and then effectively supplied to the substrates.

Supplementary Note 21

The substrate processing apparatus according to supplementary note 17, wherein the installation direction is parallel to a surface of each of the substrates.

According to the above configuration, a gas contributing to reaction supplied through the first gas supply port and the second gas supply port can be effectively supplied to the substrates.

Supplementary Note 22

The substrate processing apparatus according to supplementary note 17, wherein, when at least two first gas supply nozzles or at least two second gas supply nozzles are installed in the reaction chamber, the nozzles may be installed at different heights from the first gas port, respectively.

According to the above configuration, mixing efficiency of gas injected through the gas supply port can be improved.

In addition, according to supplementary notes 16 through 22, while the present invention provides the structure in which at least the silicon-containing gas and the chlorine-containing gas are supplied through the first gas supply port installed at the first gas supply nozzle and at least the carbon-containing gas and the reduction gas are supplied through the second gas supply port installed at the second gas supply nozzle, the present invention may provide a structure in which at least the silicon-containing gas is supplied through the first gas supply port installed at the first gas supply nozzle and at least the carbon-containing gas is supplied through the second gas supply port installed at the second gas supply nozzle.

In addition, according to supplementary notes 16 through 22, a dopant gas for controlling impurity concentration of the silicon carbide film on each of the substrates may be supplied through any one of at least the first gas supply nozzle and the second gas supply nozzle, or supplied through a gas supply nozzle other than the first gas supply nozzle and the second gas supply nozzle.

What is claimed is:

1. A substrate processing apparatus comprising:
    a reaction chamber having therein a plurality of substrates stacked to have a predetermined distance therebetween;
    a first gas supply system configured to supply one of a mixture of a silicon-containing gas and a chlorine-containing gas and a silicon/chlorine-containing gas into the reaction chamber;
    a second gas supply system configured to supply at least a carbon-containing gas and a reduction gas into the reaction chamber;
    a first gas supply nozzle installed and extending in a region where the plurality of substrates are stacked;
    a second gas supply nozzle extending in the region, the second gas supply nozzle being installed in a position different from that of the first gas supply nozzle;
    a first branch nozzle installed at the first gas supply nozzle in a direction parallel to a major surface of each of the plurality of substrates, the first branch nozzle being branched toward the second gas supply nozzle and including at least one first gas supply port;
    a second branch nozzle installed at the second gas supply nozzle in the direction parallel to the major surface of each of the plurality of substrates, second branch nozzle being branched toward the first gas supply nozzle, and including at least one second gas supply port; and
    a controller configured to control the first gas supply system and the second gas supply system to supply one of the mixture of the silicon-containing gas and the chlorine-containing gas and the silicon/chlorine-containing gas into the reaction chamber through the at least one first gas supply port and supply at least the carbon-containing gas and the reduction gas into the reaction chamber through the at least one second gas supply port such that a silicon carbide film is formed on each of the plurality of substrates, wherein the at least one first gas supply port and the at least one second gas supply port are installed adjacent to each other in a stacking direction of the plurality of substrates.

2. The substrate processing apparatus according to claim 1, wherein the first branch nozzle and the second branch nozzle are alternately disposed.

3. The substrate processing apparatus according to claim 2, wherein the first branch nozzle and the second branch nozzle are disposed to form a pair between the plurality of substrates.

4. The substrate processing apparatus according to claim 3, wherein the first branch nozzle is disposed closer to a film-forming surface of each of the plurality of substrates than the second branch nozzle.

5. The substrate processing apparatus according to claim 4, wherein the carbon-containing gas supplied through the second branch nozzle is diffused toward a gas flow of the mixture of the silicon-containing gas and the chlorine-containing gas or the silicon/chlorine-containing gas supplied through the first branch nozzle with respect to the film-forming surface of each of the plurality of substrates.

6. The substrate processing apparatus according to claim 5, further comprising a boat configured to hold the plurality of substrates, wherein each of the plurality of substrates is held by a wafer holder in the boat.

7. The substrate processing apparatus according to claim 1, wherein each of the at least one first gas supply port and the at least one second gas supply port has a slit shape parallel to a surface of each the plurality of substrates.

8. The substrate processing apparatus according to claim 1, wherein the first gas supply nozzle and the second gas supply nozzle are integrally formed.

9. The substrate processing apparatus according to claim 1, wherein each of the first gas supply nozzle and the second gas supply nozzle has a polygonal shape.

10. The substrate processing apparatus according to claim 1, wherein a portion of each of the first gas supply nozzle and the second gas supply nozzle has an arc shape.

11. The substrate processing apparatus according to claim 1, further comprising a third gas supply system configured to supply at least an impurity gas into the reaction chamber, wherein the third gas supply system supplies the impurity gas through one of the first gas supply port and the second gas supply port.

12. The substrate processing apparatus according to claim 1, comprising a plurality of the first gas supply nozzle and a plurality of the second gas supply nozzle, wherein the first gas supply nozzle and the second gas supply nozzle are alternately disposed.

13. The substrate processing apparatus according to claim 1, further comprising a third gas supply nozzle configured to supply an inert gas between the first branch nozzle and the second branch nozzle.

* * * * *